(12) United States Patent
Nirschl et al.

(10) Patent No.: US 7,974,114 B2
(45) Date of Patent: Jul. 5, 2011

(54) MEMORY CELL ARRANGEMENTS

(75) Inventors: Thomas Nirschl, Munich (DE); Michael Bollu, Kirchheim (DE); Mayk Roehrich, Dresden (DE)

(73) Assignee: Infineon Technologies AG, Munich (DE)

( * ) Notice: Subject to any disclaimer, the term of this patent is extended or adjusted under 35 U.S.C. 154(b) by 69 days.

(21) Appl. No.: 12/431,060

(22) Filed: Apr. 28, 2009

(65) Prior Publication Data

US 2010/0271855 A1    Oct. 28, 2010

(51) Int. Cl.
  *G11C 5/02*  (2006.01)
(52) U.S. Cl. .......................... 365/51; 365/63
(58) Field of Classification Search .............. None
  See application file for complete search history.

(56) References Cited

U.S. PATENT DOCUMENTS

| | | | |
|---|---|---|---|
| 5,753,953 A | | 5/1998 | Fukumoto |
| 5,923,587 A * | | 7/1999 | Choi ................ 365/185.11 |
| 6,058,044 A * | | 5/2000 | Sugiura et al. .......... 365/185.17 |
| 6,118,696 A * | | 9/2000 | Choi ................ 365/185.11 |
| 6,130,839 A * | | 10/2000 | Chang ................ 365/185.18 |
| 6,130,841 A * | | 10/2000 | Tanaka et al. ............. 365/185.22 |
| 6,327,182 B1 | | 12/2001 | Shum et al. |
| 6,438,030 B1 * | | 8/2002 | Hu et al. ................ 365/185.18 |
| 6,791,883 B2 * | | 9/2004 | Swift et al. ................ 365/185.29 |
| 6,891,221 B2 * | | 5/2005 | Lee et al. ................ 257/318 |
| 6,917,540 B2 * | | 7/2005 | Ooishi ................ 365/173 |
| 7,324,366 B2 * | | 1/2008 | Bednorz et al. ................ 365/148 |
| 7,376,013 B2 * | | 5/2008 | Khanuja et al. .......... 365/185.16 |
| 7,411,822 B2 * | | 8/2008 | Specht et al. ............. 365/185.05 |
| 7,480,180 B2 * | | 1/2009 | Umezawa ................ 365/185.18 |
| 7,492,033 B2 * | | 2/2009 | Sato et al. ................ 257/536 |
| 7,787,293 B2 * | | 8/2010 | Ohsawa ................ 365/174 |

FOREIGN PATENT DOCUMENTS

EP    1 020 925 B1    5/2003

* cited by examiner

*Primary Examiner* — Tan T. Nguyen

(57) ABSTRACT

In an embodiment, a memory cell arrangement is provided. The memory cell arrangement may include a first memory cell and a second memory cell, a first source/drain line coupled to a first source/drain region of the first memory cell and a second source/drain line coupled to a second source/drain region of the first memory cell, and a third source/drain line coupled to a first source/drain region of the second memory cell and a fourth source/drain line coupled to a second source/drain region of the second memory cell, wherein the third source/drain line is disposed proximate to the second source/drain line, and wherein the third source/drain line is disposed in the same metallization level as the second source/drain line.

33 Claims, 12 Drawing Sheets

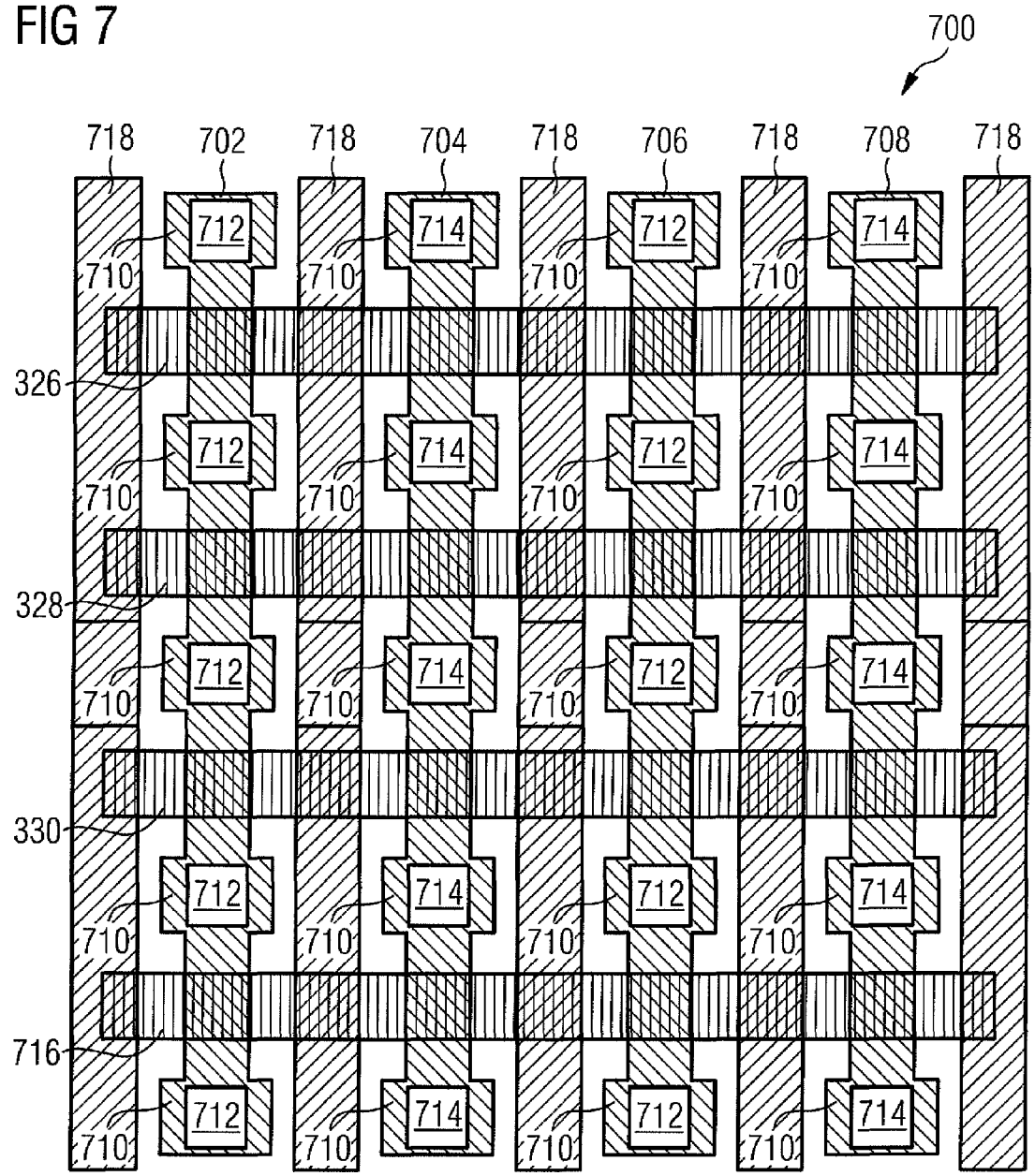

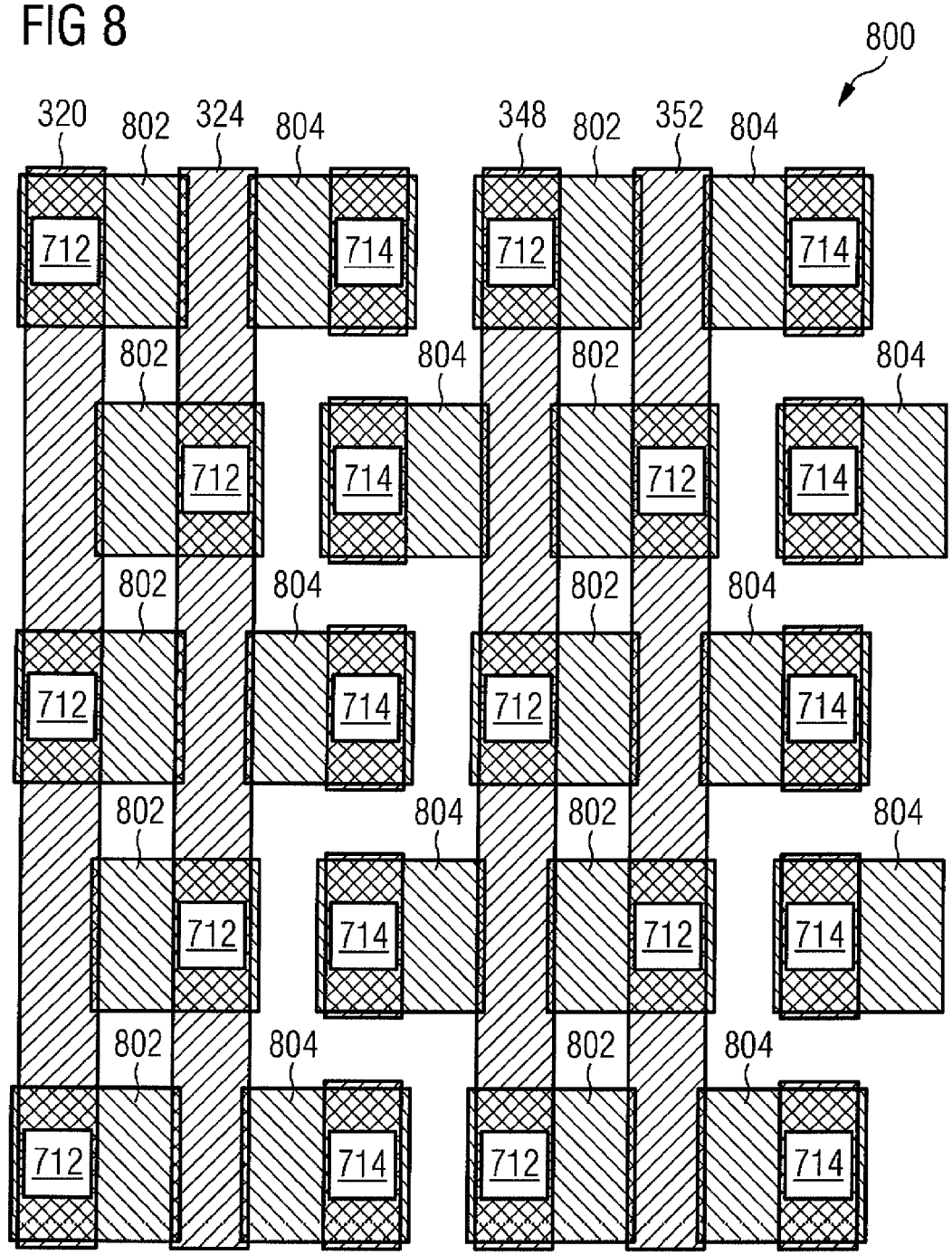

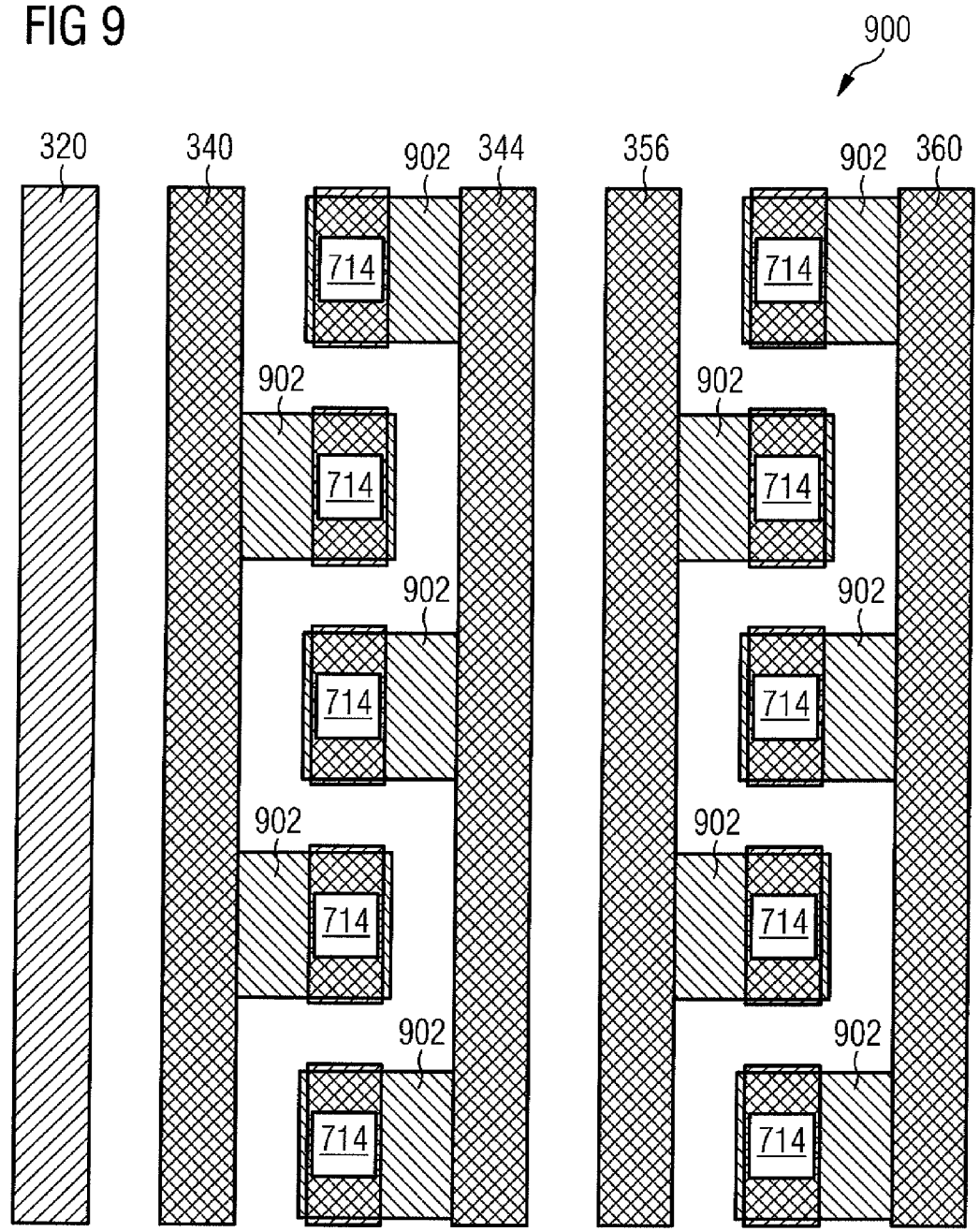

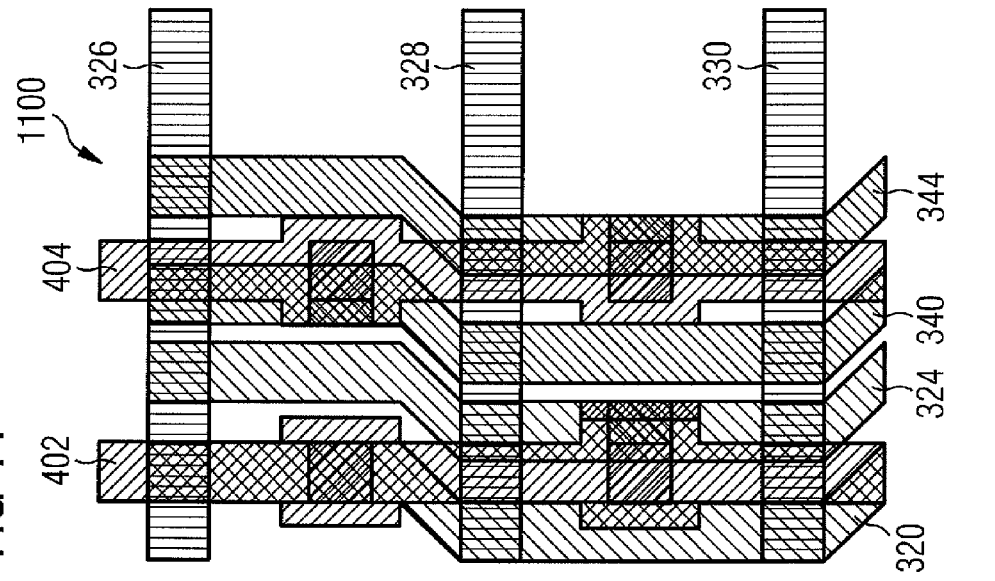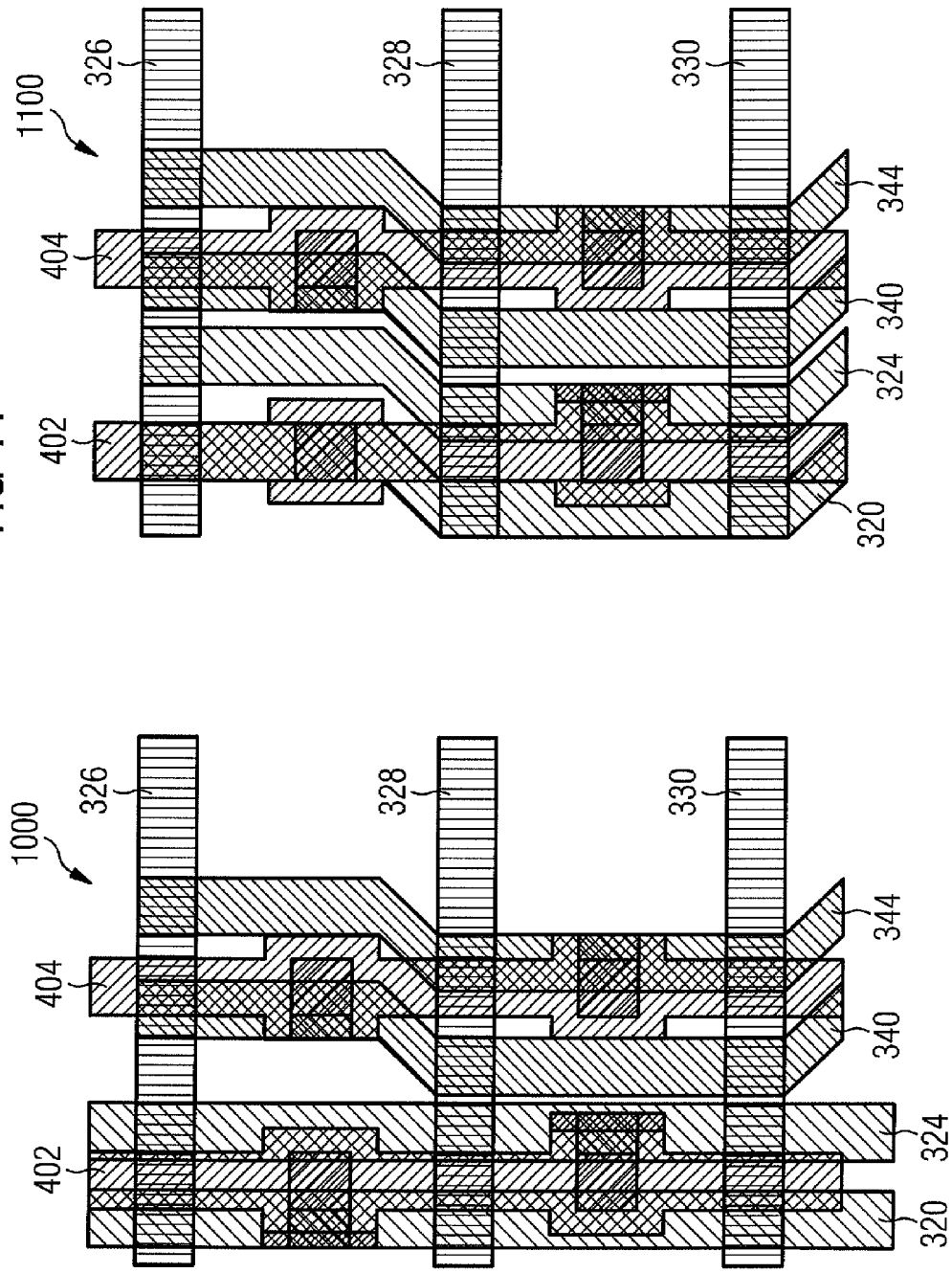

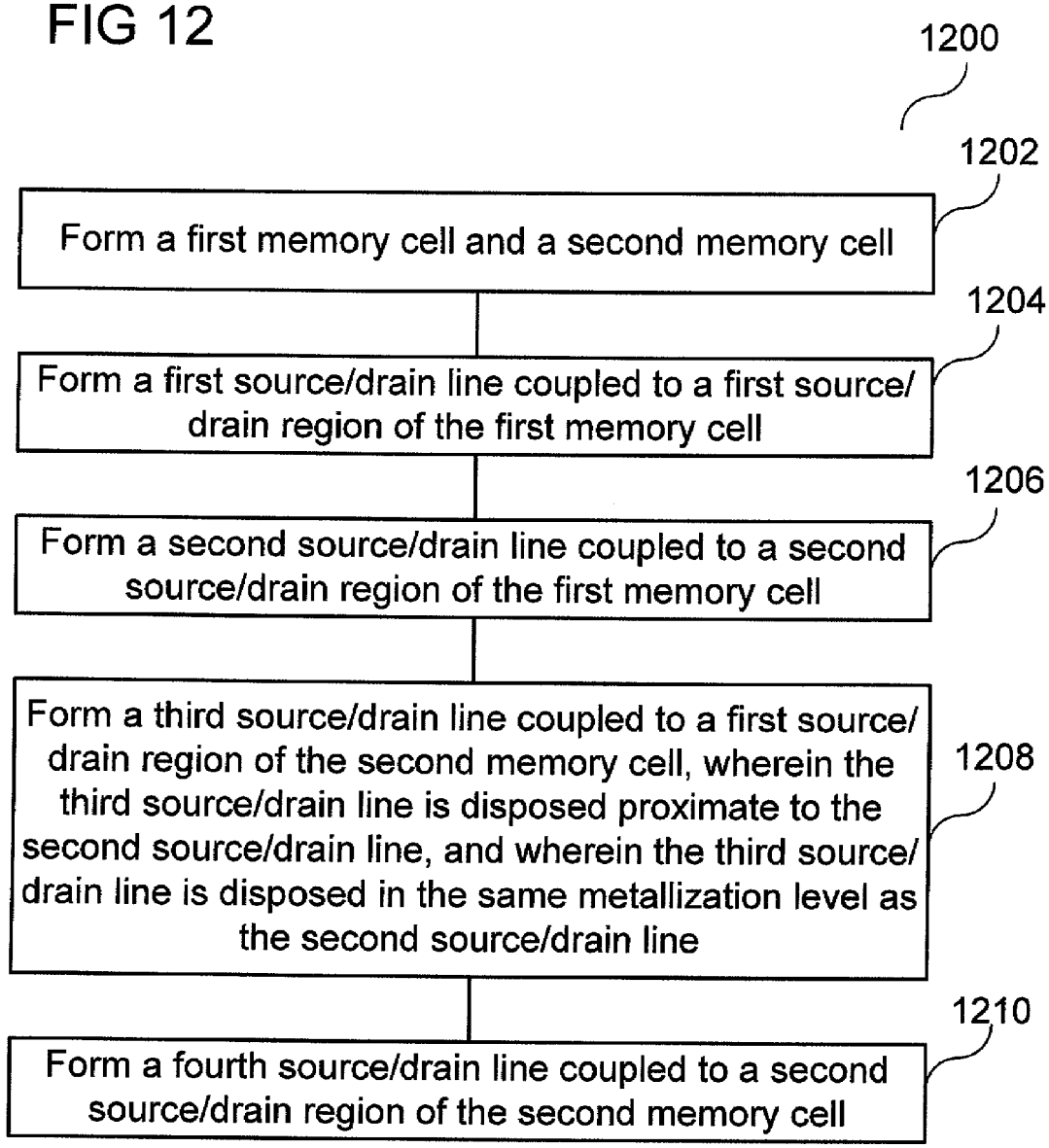

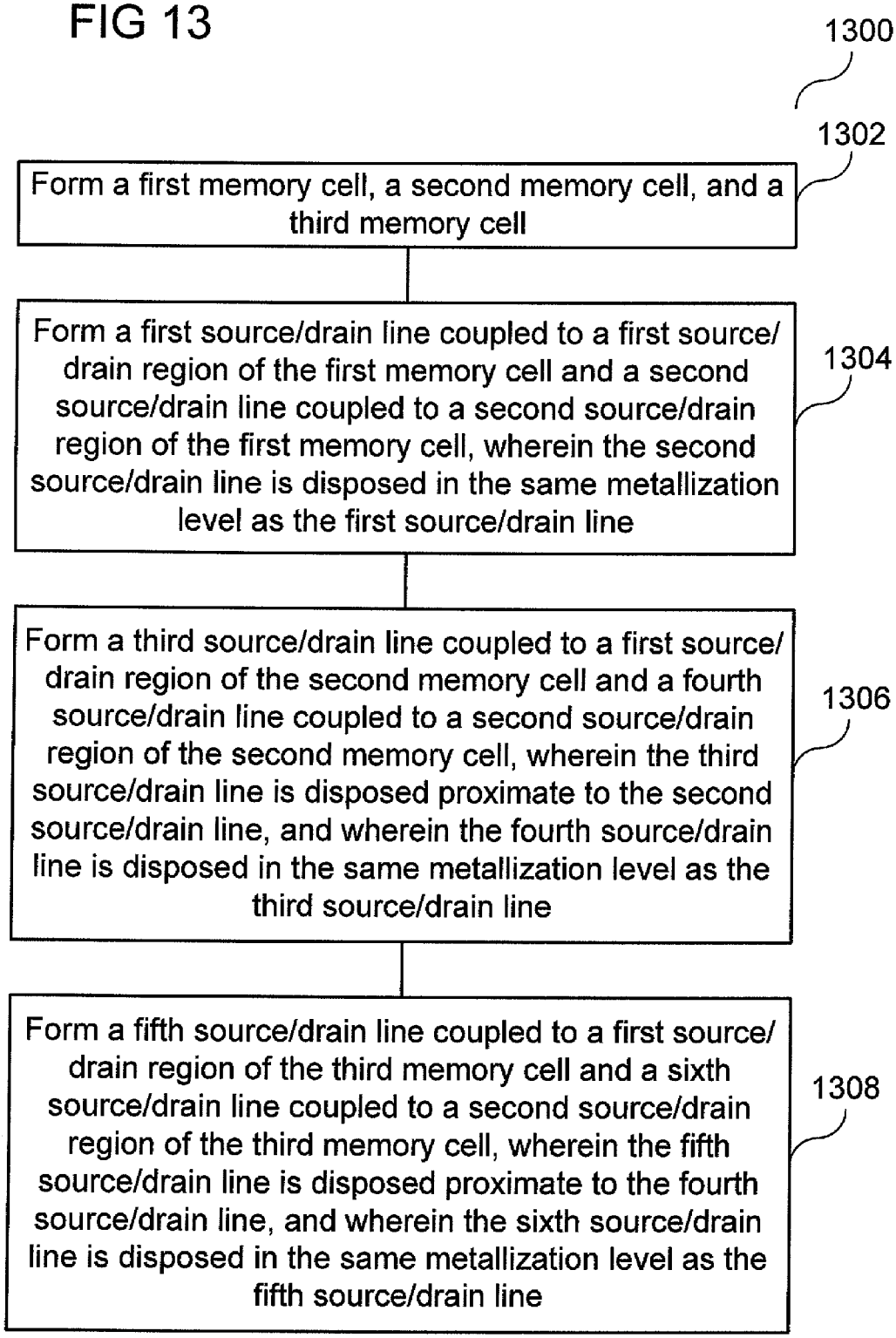

MEMORY CELL ARRANGEMENTS

TECHNICAL FIELD

Embodiments relate generally to memory cell arrangements.

BACKGROUND

In the field of e.g. embedded non-volatile memory modules, the optimization of the memory cell size is important. Furthermore, for standalone memories, CMOS (Complementary Metal Oxide Semiconductor) process complexity should be taken into account. Thus, the tradeoff between process complexity adder and chip area savings may become more important in embedded non-volatile memory modules compared to standalone memories.

In general, area optimization of e.g. a non-volatile memory cell becomes more and more important. By way of example, a so-called Uniform Channel Program (UCP) memory cell (e.g. a memory cell which is programmed and erased using the so-called Fowler-Nordheim tunneling mechanism) is a type of memory cell, the footprint of which is desired to be optimized. In a conventional layout, in a UCP memory cell arrangement, the metal pitch is limited due to interference effects (in general, due to design rules). This limitation may affect the shrink path of a UCP memory cell arrangement, in general, of a memory cell arrangement.

In a conventional memory cell arrangement, local bit lines and global bit lines are used to minimize disturbs for write operation and read operation, hence area optimization is limited.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIG. 7 shows a layout top view of a portion of a memory cell field in accordance with another embodiment;

FIG. 8 shows a layout top view of a portion of a memory cell field of FIG. 7 in accordance with the other embodiment illustrating the lines in metallization level 1 and metallization level 2;

FIG. 9 shows a layout top view of a portion of a memory cell field of FIG. 7 in accordance with the other embodiment illustrating the lines in metallization level 2 and metallization level 3;

FIG. 10 shows a layout top view of a portion of a memory cell field in accordance with yet another embodiment;

FIG. 11 shows a layout top view of a portion of a memory cell field in accordance with yet another embodiment;

FIG. 12 shows a flow diagram illustrating a method for manufacturing a memory cell arrangement in accordance with an embodiment; and FIG. 13 shows a flow diagram illustrating a method for manufacturing a memory cell arrangement in accordance with an embodiment.

DESCRIPTION

Figure 1:
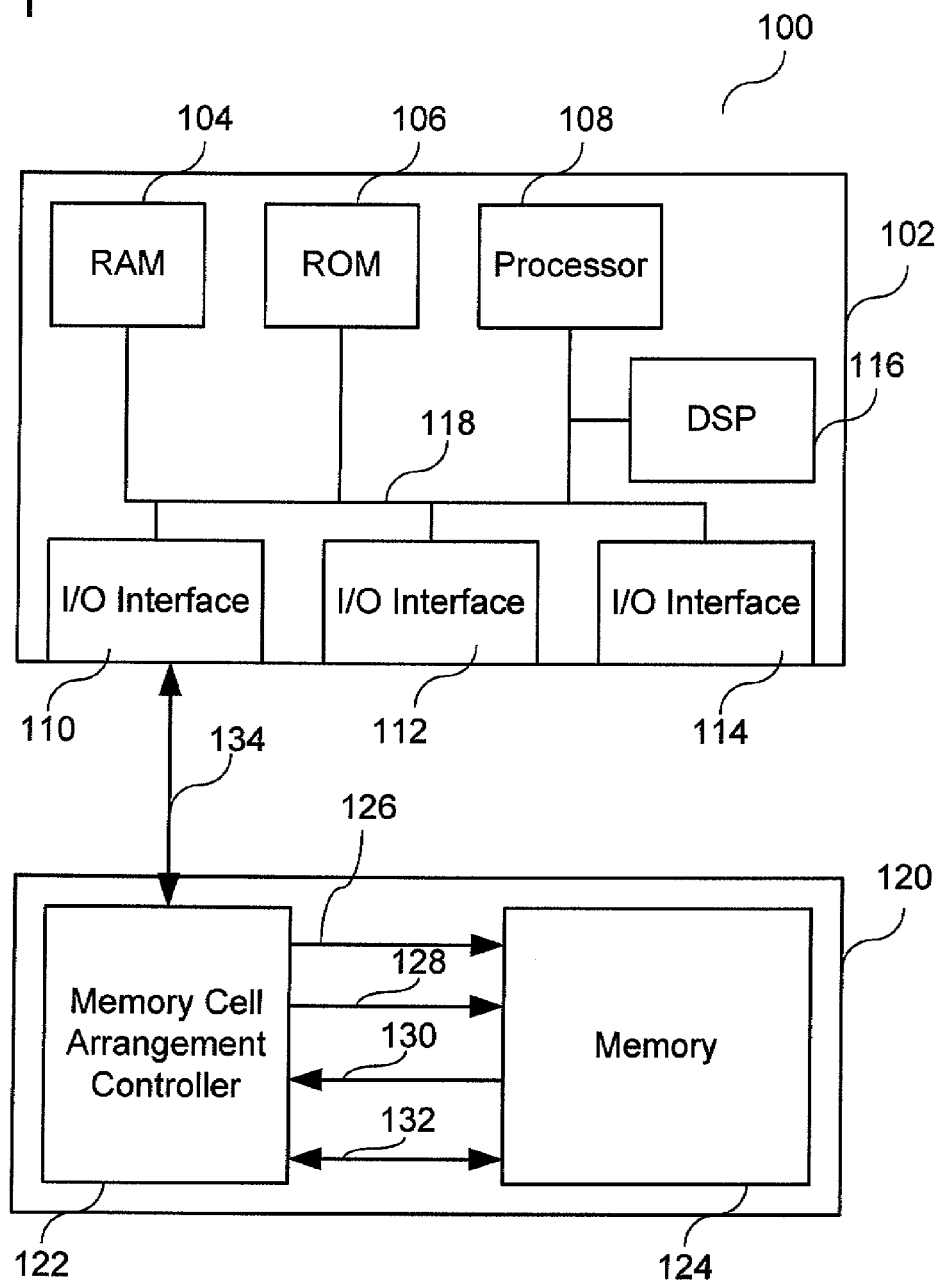
FIG. 1 shows a computer system having a memory cell arrangement in accordance with an embodiment.

FIG. 1 shows a computer system 100 having a computer arrangement 102 and a memory cell arrangement 120 in accordance with an embodiment.

In various embodiments, the computer arrangement 102 may be configured as or may include any device having a processor, e.g. having a programmable processor such as e.g. a microprocessor (e.g. a CISC (complex instruction set computer) microprocessor or a RISC (reduced instruction set computer) microprocessor). In various embodiments, the computer arrangement 102 may be configured as or may include a personal computer, a workstation, a laptop, a notebook, a personal digital assistant (PDA), a radio telephone (e.g. a wireless radio telephone or a mobile radio telephone), a camera (e.g. an analog camera or a digital camera), or another device having a processor (such as e.g. a household appliance (such as e.g. a washing machine, a dishwashing machine, etc.))

In an embodiment, the computer arrangement 102 may include one or a plurality of computer arrangement-internal random access memories (RAM) 104, e.g. one or a plurality of computer arrangement-internal dynamic random access memories (DRAM), in which for example data to be processed may be stored. Furthermore, the computer arrangement 102 may include one or a plurality of computer arrangement-internal read only memories (ROM) 106, in which for example the program code may be stored, which should be executed by a processor 108 (e.g. a processor as described above), which may also be provided in the computer arrangement 102.

Furthermore, in an embodiment, one or a plurality of input/output interfaces 110, 112, 114 (in FIG. 1, there are shown three input/output interfaces, in alternative embodiments, e.g. one, two, four, or even more than four input/output interfaces may be provided) configured to connect one or a plurality of computer arrangement-external devices (such as e.g. additional memory, one or a plurality of communication devices, one or a plurality of additional processors) to the computer arrangement 102, may be provided in the computer arrangement 102.

The input/output interfaces 110, 112, 114 may be implemented as analog interfaces and/or as digital interfaces. The input/output interfaces 110, 112, 114 may be implemented as serial interfaces and/or as parallel interfaces. The input/output interfaces 110, 112, 114 may be implemented as one or a plurality of circuits, which implements or implement a respective communication protocol stack in its functionality in accordance with the communication protocol which is respectively used for data transmission. Each of the input/output interfaces 110, 112, 114 may be configured in accordance with any communication protocol. In an embodiment, each of the input/ouput interfaces 110, 112, 114 may be implemented in accordance with one of the following communication protocols:

an ad hoc communication protocol such as e.g. Firewire or Bluetooth;

a communication protocol for a serial data transmission such as e.g. RS-232, Universal Serial Bus (USB) (e.g. USB 1.0, USB 1.1, USB 2.0, USB 3.0);

any other communication protocol such as e.g. Infrared Data Association (IrDA).

In an embodiment, the first input/output interface 110 is a USB interface (in alternative embodiments, the first input/output interface 110 may be configured in accordance with any other communication protocol such as e.g. in accordance with a communication protocol which has been described above).

In an embodiment, the computer arrangement 102 optionally may include an additional digital signal processor (DSP) 116, which may be provided e.g. for digital signal processing. Furthermore, the computer arrangement 102 may include additional communication modules (not shown) such as e.g. one or a plurality of transmitters, one or a plurality of receivers, one or a plurality of antennas, and so on.

The computer arrangement 102 may also include additional components (not shown), which are desired or required in the respective application.

In an embodiment, some or all of the circuits or components provided in the computer arrangement 102 may be coupled with each other by means of one or a plurality of computer arrangement-internal connections 118 (for example by means of one or a plurality of computer busses) configured to transmit data and/or control signals between the respectively coupled circuits or components.

Furthermore, as has been described above, the computer system 100, in accordance with an embodiment, may include the memory cell arrangement 120. In this case, the memory cell arrangement 120 may directly be coupled to the computer arrangement-internal connections 118. In such an embodiment, the memory cell arrangement 120 may be coupled with or may be even monolithically integrated together with a logic processor such as e.g. the processor 108.

The memory cell arrangement 120 may in an embodiment be configured as an integrated circuit. The memory cell arrangement 120 may further be provided in a memory module having a plurality of integrated circuits, wherein at least one integrated circuit of the plurality of integrated circuits includes a memory cell arrangement 120, as will be described in more detail below. The memory module may be a stackable memory module, wherein some of the integrated circuit may be stacked one above the other. In an embodiment, the memory cell arrangement 120 is configured as a memory card.

In an embodiment, the memory cell arrangement 120 may include a memory cell arrangement controller 122 (for example implemented by means of hard wired logic and/or by means of one or a plurality of programmable processors, e.g. by means of one or a plurality of programmable processors such as e.g. one or a plurality of programmable microprocessors (e.g. CISC (complex instruction set computer) microprocessor(s) or RISC (reduced instruction set computer) microprocessor(s)).

The memory cell arrangement 120 may further include a memory 124 having a plurality of memory cells. The memory 124 will be described in more detail below.

In an embodiment, the memory cell arrangement controller 122 may be coupled with the memory 124 by means of various connections. Each of the connections may include one or a plurality of lines and may thus have a bus width of one or a plurality of bits. Thus, by way of example, an address bus 126 may be provided, by means of which one or a plurality of addresses of one or a plurality of memory cells may be provided by the memory cell arrangement controller 122 to the memory 124, on which an operation (e.g. an erase operation, a write operation, a read operation, an erase verify operation, or a write verify operation, etc.) should be carried out. Furthermore, a data write connection 128 may be provided, by means of which the information to be written into the respectively addressed memory cell may be supplied by the memory cell arrangement controller 122 to the memory 124. Furthermore, a data read connection 130 may be provided, by means of which the information stored in the respectively addressed memory cell may be read out of the memory 124 and may be supplied from the memory 124 to the memory cell arrangement controller 122 and via the memory cell arrangement controller 122 to the computer arrangement 102, or, alternatively, directly to the computer arrangement 102 (in which case the first input/output interface 110 would directly be connected to the memory 124). A bidirectional control/state connection 132 may be used for providing control signals from the memory cell arrangement controller 122 to the memory 124 or for supplying state signals representing the state of the memory 124 from the memory 124 to the memory cell arrangement controller 122.

In an embodiment, the memory cell arrangement controller 122 may be coupled to the first input/output interface 110 by means of a communication connection 134 (e.g. by means of a USB communication connection).

In an embodiment, the memory 124 may include one chip or a plurality of chips. Furthermore, the memory cell arrangement controller 122 may be implemented on the same chip (or die) as the components of the memory 124 or on a separate chip (or die).

Figure 2:
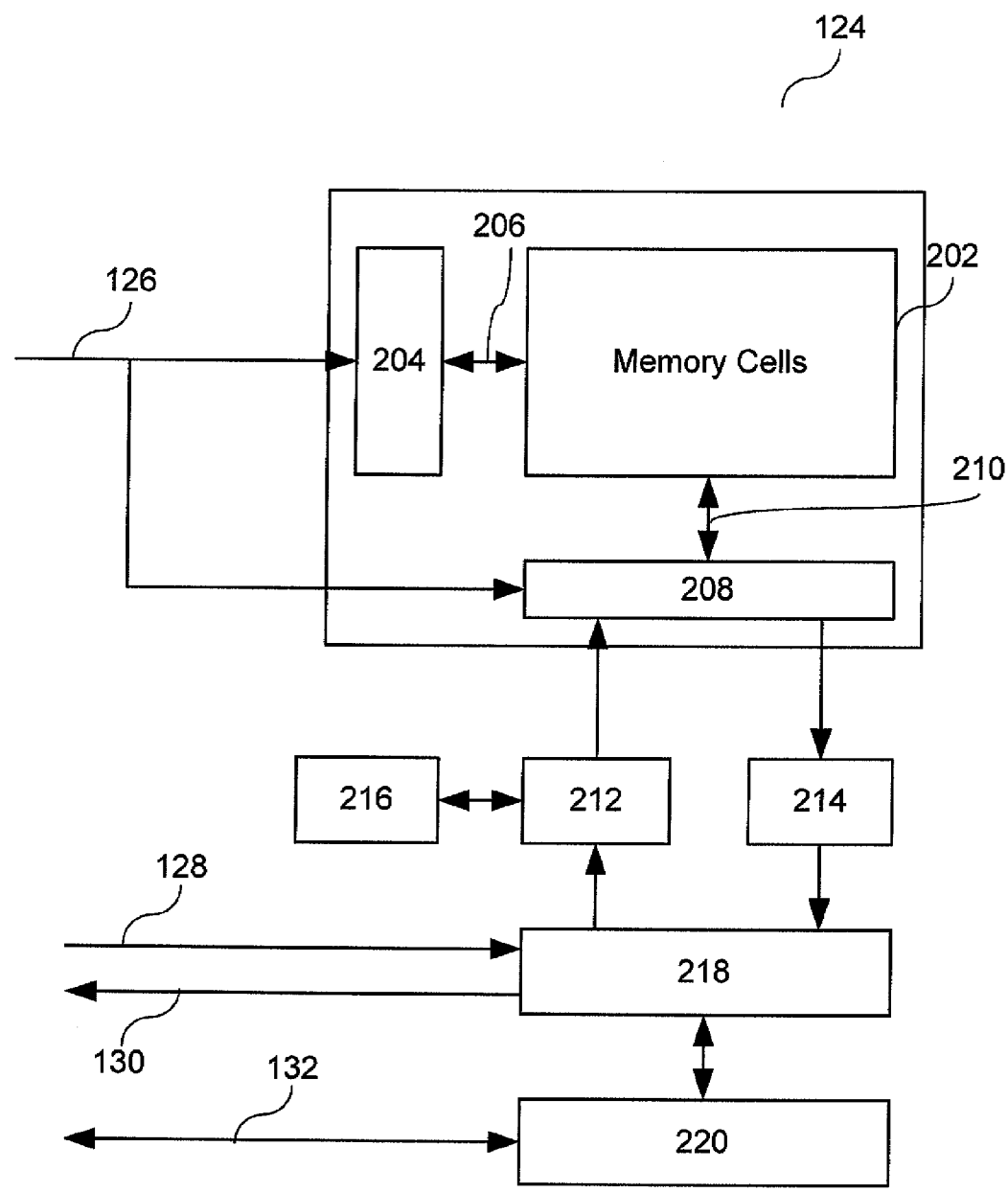
FIG. 2 shows a memory in accordance with an embodiment.

FIG. 2 shows the memory 124 of FIG. 1 in accordance with an embodiment in more detail.

In an embodiment, the memory 124 may include a memory cell field (e.g. a memory cell array) 202 having a plurality of memory cells. The memory cells may be arranged in the memory cell field 202 in the form of a matrix in rows and columns, or, alternatively, for example in zig zag form. In other embodiments, the memory cells may be arranged within the memory cell field 202 in any other manner or architecture.

In general, each memory cell may for example be coupled with a control line (e.g. a word line), a first line to be decoded (e.g. a first source/drain line, e.g. a first bit line) and with a second line to be decoded (e.g. a second source/drain line, e.g. a second bit line).

In an embodiment, in which the memory cells are arranged in the memory cell field 202 in the form of a matrix in rows and columns, a row decoder circuit 204 configured to select at least one row control line (e.g. a word line) of a plurality of row control lines 206 in the memory cell field 202 may be provided as well as a column decoder circuit 208 configured to select at least one column line, e.g. at least one line to be decoded, e.g. at least one source/drain line (e.g. a bit line) of a plurality of column lines 210 in the memory cell field 202.

In an embodiment, the memory cells may be configured as non-volatile memory cells.

A "non-volatile memory cell" may be understood as a memory cell storing data even if it is not active. In an embodiment, a memory cell may be understood as being not active e.g. if currently access to the content of the memory cell is inactive. In another embodiment, a memory cell may be understood as being not active e.g. if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

The non-volatile memory cells may be memory cells selected from a group of memory cells consisting e.g. of:
- charge storing random access memory memory cells (e.g. floating gate memory cells or charge trapping memory cells);
- ferroelectric random access memory memory cells (FeRAM, FRAM);
- magnetoresistive random access memory memory cells (MRAM);
- phase change random access memory memory cells (PCRAM, for example so called Ovonic Unified Memory (OUM) memory cells);
- conductive filament random access memory memory cells (e.g. conductive bridging random access memory memory cells (CBRAM), also referred to as programmable metallization cells (PMC), or carbon-based conductive filament random access memory memory cells);
- organic random access memory memory cells (ORAM);
- nanotube random access memory memory cells (NRAM) (e.g. carbon nanotube random access memory memory cells);
- nanowire random access memory memory cells.

In alternative embodiments, also other types of non-volatile memory cells may be used.

In various embodiments, the memory cells may be resistive memory cells.

Furthermore, the memory cells may be electrically erasable read only memory memory cells (EEPROM).

In an embodiment, the memory cells may be Flash memory cells, e.g. charge storing memory cells such as e.g. floating gate memory cells or charge trapping memory cells.

In an embodiment, each charge trapping memory cell includes a charge trapping layer structure for trapping electrical charge carriers. The charge trapping layer structure may include one or a plurality of two separate charge trapping regions. In an embodiment, the charge trapping layer structure includes a dielectric layer stack including at least one dielectric layer or at least two dielectric layers being formed above one another, wherein charge carriers can be trapped in at least one dielectric layer. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment, the charge trapping layer structure includes a dielectric layer stack including three dielectric layers being formed above one another, e.g. a first oxide layer (e.g. silicon oxide), a nitride layer as charge trapping layer (e.g. silicon nitride) on the first oxide layer, and a second oxide layer (e.g. silicon oxide or aluminum oxide) on the nitride layer. This type of dielectric layer stack is also referred to as ONO layer stack. In an alternative embodiment, the charge trapping layer structure includes two, four or even more dielectric layers being formed above one another.

In an embodiment, the memory cells may be multi-bit memory cells. As used herein the term "multi-bit" memory cell is intended to e.g. include memory cells which are configured to store a plurality of bits by spatially separated electric charge storage regions or current conductivity regions, thereby representing a plurality of logic states.

In another embodiment, the memory cells may be multi-level memory cells. As used herein the term "multi-level" memory cell is intended to e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In an embodiment, address signals are supplied to the row decoder circuit 204 and the column decoder circuit 208 by means of the address bus 126, which is coupled to the row decoder circuit 204 and to the column decoder circuit 208. The address signals uniquely identify at least one memory cell to be selected for an access operation (e.g. for one of the above described operations). The row decoder circuit 204 selects at least one row und thus at least one row control line 206 in accordance with the supplied address signal. Furthermore, the column decoder circuit 208 selects at least one column und thus at least one column line 210 in accordance with the supplied address signal.

The electrical voltages that are provided in accordance with the selected operation, e.g. for reading, programming (e.g. writing) or erasing of one memory cell or of a plurality of memory cells, are applied to the selected at least one row control line 206 and to the at least one column line 210.

In the case that each memory cell is configured in the form of a field effect transistor (e.g. in the case of a charge storing memory cell) or coupled with a respectively assigned switching field effect transistor, in an embodiment, the respective gate terminal (of the memory cell or of the switching field effect transistor) may be coupled to the row control line 206 and a first source/drain terminal (in the case of a three terminal memory cell of a field effect transistor type, a first source/drain terminal of the memory cell itself; in the case of a two terminal memory cell, a first source/drain terminal of the switching transistor, which may be coupled in series with one of the two terminals of the associated memory cell) is coupled to a first column line 210. A second source/drain terminal may be coupled to a second column line 210, e.g. a second line to be decoded (e.g. a second source/drain line, e.g. a second bit line).

In an embodiment, by way of example, for reading or for programming, a single row control line 206 and a single column line 210 are selected at the same time and are appropriately driven for reading or programming of the thus selected memory cell. In an alternative embodiment, it may be provided to respectively select a single row control line 206 and a plurality of column lines 210 at the same time for reading or for programming, thereby allowing to read or program a plurality of memory cells at the same time.

Furthermore, in an embodiment, the memory 124 includes at least one write buffer memory 212 and at least one read buffer memory 214. The at least one write buffer memory 212 and the at least one read buffer memory 214 are coupled with the column decoder circuit 208. Depending on the type of memory cell, reference memory cells 216 may be provided for reading the memory cells.

In order to program (e.g. write) a memory cell, the data to be programmed may be received by a data register 218, which is coupled with the data write connection 128, by means of the data write connection 128, and may be buffered in the at least one write buffer memory 212 during the write operation.

In order to read a memory cell, the data read from the addressed memory cell (represented e.g. by means of an electrical current, which flows through the addressed memory cell and the corresponding column line 210, which may be compared with a current threshold value in order to determine the content of the memory cell, wherein the current threshold value may e.g. be dependent from the reference memory cells 216) are e.g. buffered in the read buffer memory 214 during the read operation. The result of the comparison und therewith the logic state of the memory cell (wherein the logic state of the memory cell represents the memory content of the memory cell) may then be stored in the data register 218 and may be provided via the data read connection 130, with which the data register 218 may be coupled.

The access operations (e.g. write operations, read operations, or erase operations) may be controlled by a memory-internal controller 220, which in turn may be controlled by the memory cell arrangement controller 122 by means of the bidirectional control/state connection 132. In an alternative embodiment, the data register 218 may directly be connected to the memory cell arrangement controller 122 by means of the bidirectional control/state connection 132 and thus directly controlled thereby. In this example, the memory-internal controller 220 may be omitted.

In an embodiment, the memory cells of the memory cell field may be grouped into memory blocks or memory sectors, which may be commonly erased in an erase operation. In an embodiment, there are so many memory cells included in a memory block or memory sector such that the same amount of data may be stored therein as compared with a conventional hard disk memory sector (e.g. 512 byte), although a memory block or memory sector may alternatively also store another amount of data.

Furthermore, other common memory components (e.g. peripheral circuits such as e.g. charge pump circuits, etc.) may be provided in the memory 124, but they are neither shown in FIG. 1 nor FIG. 2 for reasons of clarity.

Figure 3:
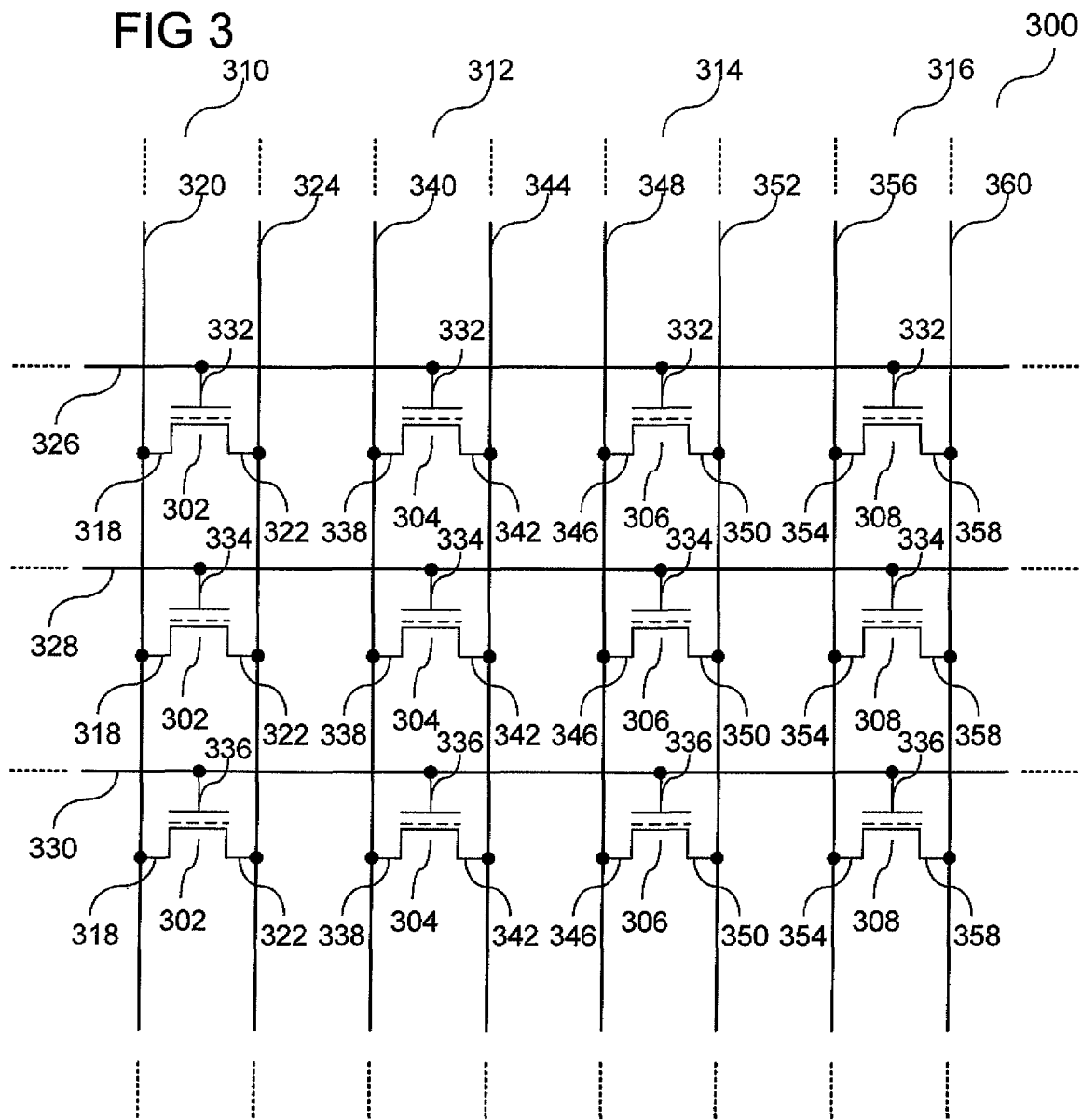
FIG. 3 shows a portion of a memory cell field in accordance with an embodiment.

FIG. 3 shows a portion 300 of the memory cell field 202 of FIG. 2 in accordance with an embodiment.

As shown in FIG. 3, a plurality of memory cells are provided in the memory cell field 202, as already described above. In an embodiment the plurality of memory cells are coupled with each other and with respective lines in accordance with a NOR architecture. In more detail, the plurality of memory cells may be arranged in a matrix form in rows and columns. By way of example, a plurality of first memory cells 302 of the plurality of memory cells may be arranged along a first direction, e.g. along a first column 310 of the memory cell matrix (also referred to as memory cell array). Furthermore, a plurality of second memory cells 304 of the plurality of memory cells may also be arranged along the first direction, e.g. along a second column 312 of the memory cell matrix, wherein the plurality of second memory cells 304 are disposed proximate to the plurality of first memory cells 302. Furthermore, a plurality of third memory cells 306 of the plurality of memory cells may also be arranged along the first direction, e.g. along a third column 314 of the memory cell matrix, wherein the plurality of third memory cells 306 are disposed proximate to the plurality of second memory cells 304, but not proximate to but remote from the plurality of first memory cells 302. Furthermore, a plurality of fourth memory cells 308 of the plurality of memory cells may also be arranged along the first direction, e.g. along a fourth column 316 of the memory cell matrix, wherein the plurality of fourth memory cells 308 are disposed proximate to the plurality of third memory cells 306, but not proximate to but remote from the plurality of second memory cells 304 and the plurality of first memory cells 302. In an embodiment, the memory cells 302, 304, 306, 308 may be configured as any of the above described types of memory cells, e.g. as transistor like memory cells, e.g. as field effect transistor like memory cells such as e.g. MOS (Metal Oxide Semiconductor) field effect transistor like memory cells. In one or more embodiments, in the case of transistor like memory cells, each memory cell may include three terminal regions, e.g. a control region (e.g. a gate region of a field effect transistor like memory cell), a first source/drain region (e.g. a source region of a field effect transistor like memory cell), and a second source/drain region (e.g. a drain region of a field effect transistor like memory cell). In an embodiment, the memory cells may be configured as charge storing memory cells, e.g. as floating gate memory cells or as charge trapping memory cells.

As also shown in FIG. 3, each first source/drain region 318 of the plurality of first memory cells 302 may be coupled with a first line 320 to be decoded (e.g. a first source/drain line 320 (e.g. a first bit line or a first source line)) and each second source/drain region 322 of the plurality of first memory cells 302 may be coupled with a second line 324 to be decoded (e.g. a second source/drain line 324 (e.g. a second bit line or a second source line)). Furthermore, in an embodiment, each gate region of the plurality of memory cells may be coupled with a control line, which will be described in more detail below. In an embodiment, the control lines (e.g. word lines) may be arranged along a second direction which is different from (non-parallel with) the first direction. In an implementation, the second direction is arranged in a non-zero degree (and not 180 degree) angle with regard to the first direction, by way of example, the second direction may be arranged in an angle of e.g. 30 degrees, 45 degrees, 60 degrees, 75 degrees, or 90 degrees with regard to the first direction. By way of example, each one of the control lines may be arranged along a respective row of the memory cell matrix. As shown in FIG. 3, as an example, three control lines (e.g. word lines) are shown, e.g. a first control line 326 (e.g. a first word line 326), a second control line 328 (e.g. a second word line 328), and a third control line 330 (e.g. a third word line 330).

In this example, the first control line 326 (e.g. the first word line 326) may be coupled with each gate region 332 of those memory cells of the plurality of memory cells, which are arranged along a first row of the memory cell matrix, the second control line 328 (e.g. the second word line 328) may be coupled with each gate region 334 of those memory cells of the plurality of memory cells, which are arranged along a second row (adjacent to and below the first row) of the memory cell matrix, and the third control line 330 (e.g. the third word line 330) may be coupled with each gate region 336 of those memory cells of the plurality of memory cells, which are arranged along a third row (adjacent to and below the second row) of the memory cell matrix.

As also shown in FIG. 3, each first source/drain region 338 of the plurality of second memory cells 304 may be coupled with a third line 340 to be decoded (e.g. a third source/drain line 340 (e.g. a third bit line or a third source line)) and each second source/drain region 342 of the plurality of second memory cells 304 may be coupled with a fourth line 344 to be decoded (e.g. a fourth source/drain line 344 (e.g. a fourth bit line or a fourth source line)). Furthermore, each first source/drain region 346 of the plurality of third memory cells 306 may be coupled with a fifth line 348 to be decoded (e.g. a fifth source/drain line 348 (e.g. a fifth bit line or a fifth source line)) and each second source/drain region 350 of the plurality of third memory cells 306 may be coupled with a sixth line 352 to be decoded (e.g. a sixth source/drain line 352 (e.g. a sixth bit line or a sixth source line)). Furthermore, each first source/drain region 354 of the plurality of fourth memory cells 308 may be coupled with a seventh line 356 to be decoded (e.g. a seventh source/drain line 356 (e.g. a seventh bit line or a seventh source line)) and each second source/drain region 358 of the plurality of fourth memory cells 308 may be coupled with an eighth line 360 to be decoded (e.g. an eighth source/drain line 360 (e.g. an eighth bit line or an eighth source line)).

As will be described in more detail below, the second line 324 to be decoded (e.g. the second source/drain line 324) may be arranged proximate to (next to, e.g. immediate next to) the first line 320 to be decoded (e.g. the first source/drain line 320), the third line 340 to be decoded (e.g. the third source/drain line 340) may be arranged proximate to (next to, e.g. immediate next to) the second line 324 to be decoded (e.g. the second source/drain line 324), the fourth line 344 to be decoded (e.g. the fourth source/drain line 344) may be arranged proximate to (next to, e.g. immediate next to) the third line 340 to be decoded (e.g. the fourth source/drain line 340), the fifth line 348 to be decoded (e.g. the fifth source/drain line 348) may be arranged proximate to (next to, e.g. immediate next to) the fourth line 344 to be decoded (e.g. the fourth source/drain line 344), the sixth line 352 to be decoded (e.g. the sixth source/drain line 352) may be arranged proximate to (next to, e.g. immediate next to) the fifth line 348 to be decoded (e.g. the fifth source/drain line 348), the seventh line 356 to be decoded (e.g. the seventh source/drain line 356) may be arranged proximate to (next to, e.g. immediate next to) the sixth line 352 to be decoded (e.g. the sixth source/drain line 352), and the eighth line 360 to be decoded (e.g. the eighth source/drain line 360) may be arranged proximate to (next to, e.g. immediate next to) the seventh line 356 to be decoded (e.g. the seventh source/drain line 356), and so on.

As also will be described in more detail below, in an embodiment, the third line 340 to be decoded (e.g. the third source/drain line 340) may be disposed in the same metallization level (e.g. in the back-end-of-line (BEOL) process) as the second line 324 to be decoded (e.g. the second source/drain line 324). Furthermore, the first line 320 to be decoded (e.g. the first source/drain line 320) may be arranged in a different metallization level than the second line 324 to be decoded (e.g. the second source/drain line 324). In one or more embodiments, the fourth line 344 to be decoded (e.g. the fourth source/drain line 344) may be arranged in a different metallization level than the second line 324 to be decoded (e.g. the second source/drain line 324). In one or more embodiments, the fourth line 344 to be decoded (e.g. the fourth source/drain line 344) may be arranged in the same metallization level as the first line 320 to be decoded (e.g. the first source/drain line 320). In one or more embodiments, the sixth line 352 to be decoded (e.g. the sixth source/drain line 352) may be arranged in a different metallization level than the fifth line 348 to be decoded (e.g. the fifth source/drain line 348), which in turn may be arranged in the same metallization level as the fourth line 344 to be decoded (e.g. the fourth source/drain line 344). In one or more embodiments, the sixth line 352 to be decoded (e.g. the sixth source/drain line 352) may be arranged in the same metallization level as the second line 324 to be decoded (e.g. the second source/drain line 324). In one or more embodiments, the seventh line 356 to be decoded (e.g. the seventh source/drain line 356) may be arranged in the same metallization level as the sixth line 352 to be decoded (e.g. the sixth source/drain line 352). In one or more embodiments, the eighth line 360 to be decoded (e.g. the eighth source/drain line 360) may be arranged in the same metallization level as the fifth line 348 to be decoded (e.g. the fifth source/drain line 348).

Thus, in one or more embodiments, illustratively, two adjacent columns, each comprising e.g. a bit line and a source line, may be combined to optimize area consumption. By this combination, the source line of a respective column may be routed within one layer (one metallization layer or one metallization level), the bit line of the respective column may be routed within another layer (another metallization layer or another metallization level), and the source line of a respective other immediately adjacent column may be routed within the other layer (the other metallization layer or the other metallization level), and the bit line of the respective other column may be routed within the same layer as the source line of the respective column (the one metallization layer or the one metallization level).

In one or more embodiments, the following lines to be decoded (e.g. the following source/drain lines) may be disposed in the metallization level 3 of the memory cell arrangement: the second line 324 to be decoded (e.g. the second source/drain line 324), the third line 340 to be decoded (e.g. the third source/drain line 340), the sixth line 352 to be decoded (e.g. the sixth source/drain line 352), and the seventh line 356 to be decoded (e.g. the seventh source/drain line 356), and so on.

In one or more embodiments, the following lines to be decoded (e.g. the following source/drain lines) may be disposed in the metallization level 3 of the memory cell arrangement: the first line 320 to be decoded (e.g. the first source/drain line 320), the fourth line 344 to be decoded (e.g. the fourth source/drain line 344), the fifth line 348 to be decoded (e.g. the fifth source/drain line 348), and the eighth line 360 to be decoded (e.g. the eighth source/drain line 360), and so on.

In one or more embodiments, the control lines may be disposed in another metallization plane than the lines to be decoded (e.g. the source/drain lines). By way of example, in one or more embodiments, the control lines may be disposed in a metallization level below the metallization levels in which the source/drain lines are disposed. By way of example, in one or more embodiments, the control lines may be disposed in the metallization level 0 or in the metallization level 1 of the memory cell arrangement.

It should be mentioned that in alternative embodiments, the lines may also be arranged in other metallization levels, e.g. in higher or lower metallization levels.

Figure 4:
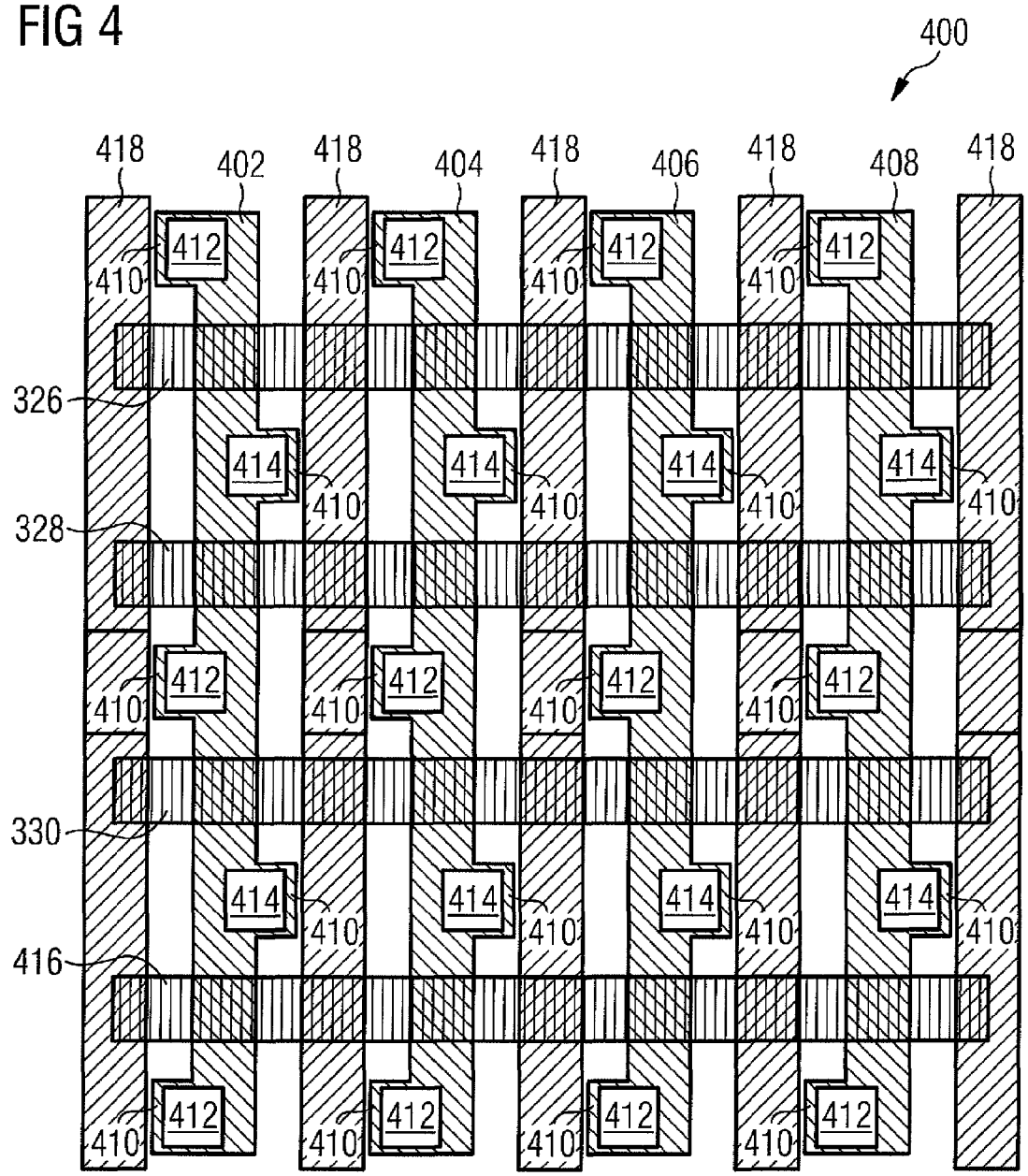
FIG. 4 shows a layout top view of a portion of a memory cell field in accordance with an embodiment.

FIG. 4 shows a layout top view 400 of a portion of a memory cell field in accordance with an embodiment.

As shown in FIG. 4, a plurality of active areas 402, 404, 406, 408 (in this example running in the first direction) (e.g. made of (doped or undoped) silicon) are provided, wherein the active areas 402, 404, 406, 408 are electrically isolated from each other by means of field isolation regions 418, e.g. by means of shallow trench isolations (STIs) 418. The active areas 402, 404, 406, 408 may be formed as strips, however, flags 410 may be provided, which may extend in an angle with respect to (e.g. perpendicular to) the main extension direction of the active areas 402, 404, 406, 408 (e.g. the first direction), in other words, the flags 410 may extend along the second direction. The flags 410 may be electrically coupled with the source/drain regions provided in portions of the active areas 402, 404, 406, 408. The flags 410 may serve as landing regions for vias 412, 414 (electrically conductive material (e.g. tungsten) formed in contact holes which may be formed through interdielectric material (such as silicon oxide or silicon nitride) formed on the active areas 402, 404, 406, 408) to electrically couple the source/drain regions with source/drain lines provided in upper metallization levels as will be described in more detail below.

Furthermore, as shown in FIG. 4, the control lines 326, 328, 330, 416 (e.g. world lines 326, 328, 330, 416) may be provided (e.g. in the metallization level 0) and may be electrically coupled with the gate regions 332 of the memory cells. The control lines 326, 328, 330, 416 (e.g. world lines 326, 328, 330, 416) may intersect with the lines to be decoded (e.g.

source/drain lines (e.g. bit lines or source lines)). In an example, the control lines 326, 328, 330, 416 (e.g. world lines 326, 328, 330, 416) run in an angle with respect to (e.g. perpendicular to) the main extension direction of the active areas 402, 404, 406, 408 and the lines to be decoded (e.g. source/drain lines (e.g. bit lines or source lines)) (e.g. the first direction). In an example, the control lines 326, 328, 330, 416 (e.g. world lines 326, 328, 330, 416) run in the second direction.

Figure 5:
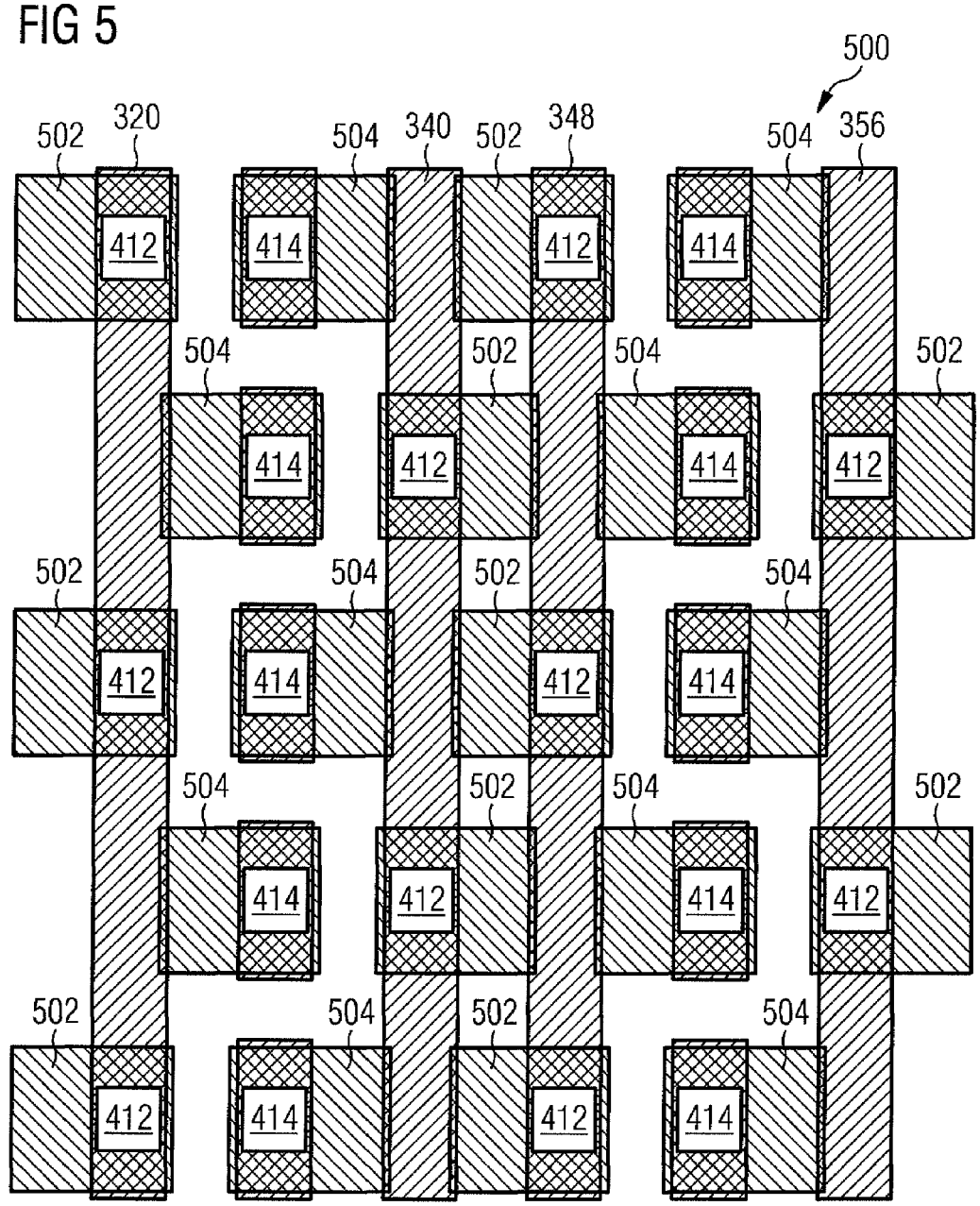
FIG. 5 shows a layout top view of a portion of a memory cell field of FIG. 4 in accordance with an embodiment illustrating the lines in metallization level 1 and metallization level 2.
Figure 6:
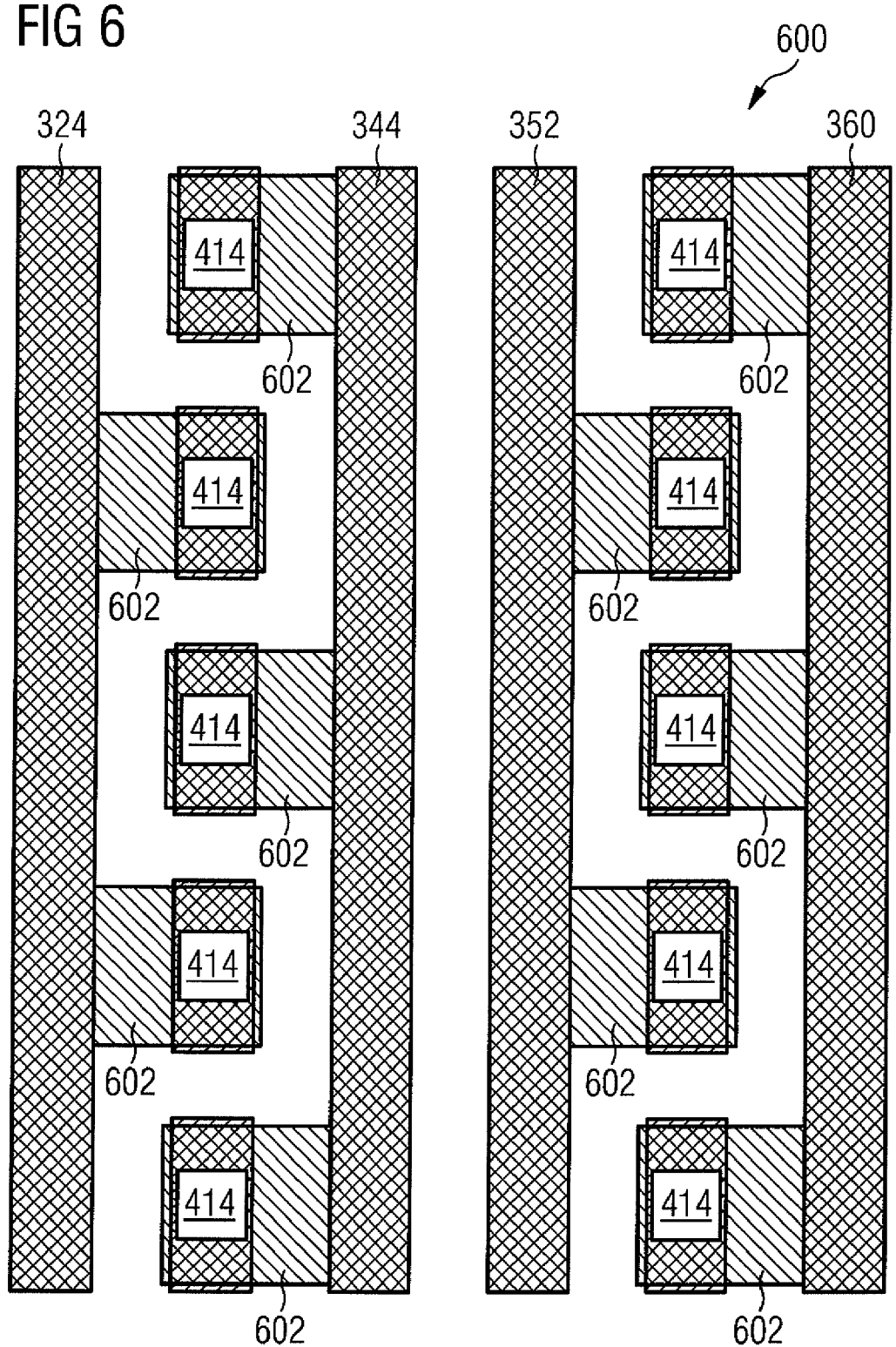
FIG. 6 shows a layout top view of a portion of a memory cell field of FIG. 4 in accordance with an embodiment illustrating the lines in metallization level 2 and metallization level 3.

FIG. 5 shows a layout top view 500 of a portion of a memory cell field of FIG. 4 in accordance with an embodiment illustrating the lines in metallization level 1 and metallization level 2. Furthermore, FIG. 6 shows a layout top view 600 of a portion of a memory cell field of FIG. 4 in accordance with an embodiment illustrating the lines in metallization level 2 and metallization level 3. In this example shown in FIG. 5 and FIG. 6, the bit line and the source line of each memory cell column are arranged in different metallization levels.

In an example, first vias 412 may be coupled with the source regions in the active areas 402, 404, 406, 408 via first line portions 502 (first wiring) of the metallization level 1 and second vias 414 may be coupled with the drain regions in the active areas 402, 404, 406, 408 via second line portions 504 (second wiring) of the metallization level 1.

Furthermore, the first vias 412 may be coupled with lines to be decoded (e.g. bit lines), which may be arranged in the metallization level 2 being provided above the metallization level(s) (e.g. metallization level 0 and metallization level 1) in which the control lines 326, 328, 330, 416 (e.g. world lines 326, 328, 330, 416) are provided. In more detail, FIG. 5 shows the following lines to be decoded being arranged in the metallization level 2: the first line 320 to be decoded (e.g. the first source/drain line 320 (e.g. the first bit line 320)), the third line 340 to be decoded (e.g. the third source/drain line 340 (e.g. the third bit line 340)), the fifth line 348 to be decoded (e.g. the fifth source/drain line 348 (e.g. the fifth bit line 348)), and the seventh line 356 to be decoded (e.g. the seventh source/drain line 356 (e.g. the seventh bit line)). It is to be noted that in this embodiment, two respective bit lines of different memory cell columns may be arranged proximate to each other within the same metallization level (in FIG. 5, e.g., the third line 340 to be decoded (e.g. the third source/drain line 340 (e.g. the third bit line 340)) and the fifth line 348 to be decoded (e.g. the fifth source/drain line 348 (e.g. the fifth bit line 348)) are arranged adjacent to each other in a minimal distance that is smaller than the distance that would be possible for a bit line and a source line of the same memory cell column.

In this example, the source lines are arranged in a different metallization level than the bit lines. By way of example, the source lines may be arranged in the metallization level 3, as will be described in more detail below, and may be coupled with the source regions of the respective memory cells of a memory cell column by means of the second vias 414, which, in an example, do not electrically contact any wiring in the metallization level 2, but extend from the second line portions in the metallization level 1 directly through to the metallization level 3 and are in electrical contact with the source lines arranged in the metallization level 3.

This is illustrated in FIG. 6. Furthermore, the second vias 414 may be coupled with lines to be decoded (e.g. source lines), which may be arranged in the metallization level 3 being provided above the metallization level(s) (e.g. metallization level 0 and metallization level 1) in which the control lines 326, 328, 330, 416 (e.g. world lines 326, 328, 330, 416) are provided, and above the metallization level (e.g. metallization level 2), in which the lines are provided. In more detail, FIG. 6 shows the following lines to be decoded being arranged in the metallization level 3: the second line 324 to be decoded (e.g. the second source/drain line 324 (e.g. the second source line 324)), the fourth line 344 to be decoded (e.g. the fourth source/drain line 344 (e.g. the fourth source line 344)), the sixth line 352 to be decoded (e.g. the sixth source/drain line 352 (e.g. the sixth source line 352)), and the eighth line 360 to be decoded (e.g. the eighth source/drain line 360 (e.g. the eighth bit line 360)). It is to be noted that in this embodiment, two respective source lines of different memory cell columns may be arranged proximate to each other within the same metallization level (in FIG. 6, e.g., the fourth line 344 to be decoded (e.g. the fourth source/drain line 344 (e.g. the fourth source line 344)) and the sixth line 352 to be decoded (e.g. the sixth source/drain line 352 (e.g. the sixth bit line 352)) are arranged adjacent to each other in a minimal distance that is smaller than the distance that would be possible for a bit line and a source line of the same memory cell column. As also shown in FIG. 6, the lines 324, 344, 352, 360 to be decoded, which are arranged in the metallization level 3, are coupled with the second vias 414 by means of horizontal line portions 602 (arranged in the metallization level 3) extending from the respective line 324, 344, 352, 360 to be decoded in the second direction to the associated second via 414.

As shown in FIG. 5 and FIG. 6, the bit lines and the source lines of the same memory cell column (i.e. the bit lines and the source lines respectively being coupled to the same memory cells) vertically overlap (partially or fully) each other (in other words, partially or fully overlap each other in vertical direction) and only one "column" may be provided for the second vias 414 to provide a contact through the metallization level 2 to the metallization level 3.

It is to be noted that in an alternative embodiment, the arrangement of the bit lines and the source lines may be exchanged, i.e. the bit lines may be arranged in the metallization level 3 and the source lines may be arranged in the metallization level 2 (in general, in an embodiment, the bit lines may be arranged in a metallization level above the metallization level in which the source lines are arranged).

FIG. 7 shows a layout top view 700 of a portion of a memory cell field in accordance with another embodiment.

As shown in FIG. 7, a plurality of active areas 702, 704, 706, 708 (in this example running in the first direction) (e.g. made of (doped or undoped) silicon) are provided, wherein the active areas 702, 704, 706, 708 are electrically isolated from each other by means of field isolation regions 718, e.g. by means of shallow trench isolations (STIs) 718. The active areas 702, 704, 706, 708 may be formed as strips, however, landing pads 710 may be provided, which illustratively may be provided as laterally enlarged portions of the active areas 702, 704, 706, 708. The landing pads 710 may be electrically coupled with the source/drain regions provided in portions of the active areas 702, 704, 706, 708. The landing pads 710 may serve as landing regions for vias 712, 714 (electrically conductive material (e.g. tungsten) formed in contact holes which may be formed through interdielectric material (such as silicon oxide or silicon nitride) formed on the active areas 702, 704, 706, 708) to electrically couple the source/drain regions with source/drain lines provided in upper metallization levels as will be described in more detail below.

Furthermore, as shown in FIG. 7, the control lines 326, 328, 330, 716 (e.g. world lines 326, 328, 330, 716) may be provided (e.g. in the metallization level 0) and may be electrically coupled with the gate regions 332 of the memory cells. The control lines 326, 328, 330, 716 (e.g. world lines 326, 328, 330, 716) may intersect with the lines to be decoded (e.g.

source/drain lines (e.g. bit lines or source lines)). In an example, the control lines 326, 328, 330, 716 (e.g. world lines 326, 328, 330, 716) run in an angle with respect to (e.g. perpendicular to) the main extension direction of the active areas 402, 404, 406, 408 and the lines to be decoded (e.g. source/drain lines (e.g. bit lines or source lines)) (e.g. the first direction). In an example, the control lines 326, 328, 330, 716 (e.g. world lines 326, 328, 330, 716) run in the second direction.

FIG. 8 shows a layout top view 800 of a portion of a memory cell field in accordance with another embodiment illustrating the lines in metallization level 1 and metallization level 2. Furthermore, FIG. 9 shows a layout top view 900 of a portion of a memory cell field in accordance with the other embodiment illustrating the lines in metallization level 2 and metallization level 3. In this example shown in FIG. 8 and FIG. 9, the bit line and the source line of each memory cell column are arranged in the same metallization level and the bit line and the source line of respective immediate adjacent memory cell columns are arranged in a different metallization level.

In an example, first vias 712 may be coupled with the source regions in the active areas 402, 404, 406, 408 via first line portions 802 (first wiring) of the metallization level 1 and second vias 714 may be coupled with the drain regions in the active areas 402, 404, 406, 408 via second line portions 804 (second wiring) of the metallization level 1.

Furthermore, the first vias 712 may be coupled with lines to be decoded (e.g. bit lines or source lines), which may be arranged in the metallization level 2 being provided above the metallization level(s) (e.g. metallization level 0 and metallization level 1) in which the control lines 326, 328, 330, 716 (e.g. world lines 326, 328, 330, 716) are provided. In more detail, FIG. 8 shows the following lines to be decoded being arranged in the metallization level 2: the first line 320 to be decoded (e.g. the first source/drain line 320 (e.g. the first bit line 320)), the second line 324 to be decoded (e.g. the second source/drain line 324 (e.g. the second source line 324)), the fifth line 348 to be decoded (e.g. the fifth source/drain line 348 (e.g. the fifth bit line 348)), and the sixth line 352 to be decoded (e.g. the sixth source/drain line 352 (e.g. the sixth source line)). It is to be noted that in this embodiment, two respective lines to be decoded of the same memory cell column may be arranged proximate to each other within the same metallization level (in FIG. 8, e.g., the first line 320 to be decoded (e.g. the first source/drain line 320 (e.g. the first bit line 320)) and the second line 324 to be decoded (e.g. the second source/drain line 324 (e.g. the second source line 324)).

In this example, the source/drain lines of directly adjacent memory cell columns are arranged in a different metallization level than the source/drain lines of the respective memory cell column. By way of example, the source/drain lines of the memory cell columns arranged directly adjacent to a memory cell column, the source/drain lines of which are arrangen in the metallization level 2, may be arranged in the metallization level 3, as will be described in more detail below, and may be coupled with the source/drain regions of the respective memory cells of a directly adjacent memory cell column by means of the second vias 714, which, in an example, do not electrically contact any wiring in the metallization level 2, but extend from the second line portions 804 in the metallization level 1 directly through to the metallization level 3 and are in electrical contact with the source/drain lines arranged in the metallization level 3.

This is illustrated in FIG. 9. Furthermore, the second vias 714 may be coupled with lines to be decoded (e.g. source lines), which may be arranged in the metallization level 3 being provided above the metallization level(s) (e.g. metallization level 0 and metallization level 1) in which the control lines 326, 328, 330, 716 (e.g. world lines 326, 328, 330, 716) are provided, and above the metallization level (e.g. metallization level 2), in which the lines are provided. In more detail, FIG. 9 shows the following lines to be decoded being arranged in the metallization level 3: the third line 340 to be decoded (e.g. the third source/drain line 340 (e.g. the third bit line 340)), the fourth line 344 to be decoded (e.g. the fourth source/drain line 344 (e.g. the fourth source line 344)), the seventh line 356 to be decoded (e.g. the seventh source/drain line 356 (e.g. the seventh bit line 356)), and the eighth line 360 to be decoded (e.g. the eighth source/drain line 360 (e.g. the eighth bit line 360)). It is to be noted that in this embodiment, two respective source/drain lines of the same memory cell columns may be arranged proximate to each other within the same metallization level (in FIG. 9, e.g., the third line 340 to be decoded (e.g. the third source/drain line 340 (e.g. the third bit line 340)) and the fourth line 344 to be decoded (e.g. the fourth source/drain line 344 (e.g. the fourth source line 344)). As also shown in FIG. 9, the lines 340, 344, 356, 360 to be decoded, which are arranged in the metallization level 3, are coupled with the second vias 714 by means of horizontal line portions 902 (arranged in the metallization level 3) extending from the respective line 340, 344, 356, 360 to be decoded in the second direction to the associated second via 714.

As shown in FIG. 8 and FIG. 9, the bit lines and the source lines of the directly adjacent memory cell columns (i.e. the bit lines and the source lines respectively being coupled to the different memory cells) vertically overlap (partially or fully) each other and only one "column" may be provided for the second vias 714 to provide a contact through the metallization level 2 to the metallization level 3.

FIG. 10 shows a layout top view 1000 of a portion of a memory cell field in accordance with yet another embodiment. As shown in FIG. 10, this embodiments is similar to the embodiment shown in FIGS. 4 to 6 in the sense that the lines to be decoded of the same memory cell column are arranged in the same metallization level and the lines to be decoded of respective immediate adjacent memory cell columns are arranged in a different metallization level. Furthermore, in this embodiment, the third third line 340 to be decoded (e.g. the third source/drain line 340 (e.g. the third bit line)) and the fourth line 344 to be decoded (e.g. the fourth source/drain line 344 (e.g. the fourth source line)) have a zigzag shape and run partially in a very small distance to the second line 324 to be decoded (e.g. the second source/drain line 324 (e.g. the second source line)). By way of example, the straight first line 320 to be decoded (e.g. the first source/drain line 320 (e.g. the first bit line)) and the straight second line 324 to be decoded (e.g. the second source/drain line 324 (e.g. the second source line)) are arranged in the metallization level 2 and the zigzag shape third third line 340 to be decoded (e.g. the third source/drain line 340 (e.g. the third bit line)) and the zigzag shape fourth line 344 to be decoded (e.g. the fourth source/drain line 344 (e.g. the fourth source line)) are arranged in the metallization level 3. Furthermore, in this embodiment, the fifth line 348 to be decoded (e.g. the fifth source/drain line 348 (e.g. the fifth bit line)) and the sixth line 352 to be decoded (e.g. the sixth source/drain line 352 (e.g. the sixth source line)) may be straight lines and may be arranged in the metallization level 2 (not shown in FIG. 10), and the seventh line 356 to be decoded (e.g. the seventh source/drain line 356 (e.g. the seventh bit line)) and the eighth line 360 to be decoded (e.g. the eighth source/drain line 360 (e.g. the eighth source line)) may be zigzag lines and may be arranged in the metallization level 3 (also not shown in FIG. 10).

FIG. 11 shows a layout top view 1100 of a portion of a memory cell field in accordance with yet another embodiment. As shown in FIG. 11, this embodiments is similar to the embodiment shown in FIGS. 4 to 6 and 10 in the sense that the lines to be decoded of the same memory cell column are arranged in the same metallization level and the lines to be decoded of respective immediate adjacent memory cell columns are arranged in a different metallization level. Furthermore, in this embodiment, the third third line 340 to be decoded (e.g. the third source/drain line 340 (e.g. the third bit line)) and the fourth line 344 to be decoded (e.g. the fourth source/drain line 344 (e.g. the fourth source line)) have a zigzag shape and run partially in a very small distance to the second line 324 to be decoded (e.g. the second source/drain line 324 (e.g. the second source line)). By way of example, the first line 320 to be decoded (which in this embodiment also has a zigzag shape) (e.g. the first source/drain line 320 (e.g. the first bit line)) and the second line 324 to be decoded (which in this embodiment also has a zigzag shape) (e.g. the second source/drain line 324 (e.g. the second source line)) are arranged in the metallization level 2 and the zigzag shape third third line 340 to be decoded (e.g. the third source/drain line 340 (e.g. the third bit line)) and the zigzag shape fourth line 344 to be decoded (e.g. the fourth source/drain line 344 (e.g. the fourth source line)) are arranged in the metallization level 3. Furthermore, in this embodiment, the fifth line 348 to be decoded (e.g. the fifth source/drain line 348 (e.g. the fifth bit line)) and the sixth line 352 to be decoded (e.g. the sixth source/drain line 352 (e.g. the sixth source line)) may be zigzag lines and may be arranged in the metallization level 2 (not shown in FIG. 11), and the seventh line 356 to be decoded (e.g. the seventh source/drain line 356 (e.g. the seventh bit line)) and the eighth line 360 to be decoded (e.g. the eighth source/drain line 360 (e.g. the eighth source line)) may be zigzag lines and may be arranged in the metallization level 3 (also not shown in FIG. 11).

As described in detail for example with reference to FIGS. 7 to 11, in one or more embodiments, a memory cell arrangement is provided, which may include a plurality of first memory cells arranged along a first direction, a plurality of second memory cells arranged along a second direction, wherein the second direction is different from the first direction, a first source/drain line coupled to each first source/drain region of the first memory cells and a second source/drain line coupled to each second source/drain region of the first memory cells, wherein the second source/drain line is disposed in the same metallization level as the first source/drain line, and a third source/drain line coupled to each first source/drain region of the second memory cells and a fourth source/drain line coupled to each second source/drain region of the second memory cells, wherein the fourth source/drain line is disposed in the same metallization level as the third source/drain line.

As also described in detail for example with reference to FIGS. 7 to 11, in one or more embodiments, a memory cell arrangement is provided, which may include a first memory cell, a second memory cell, a third memory cell, a first source/drain line coupled to a first source/drain region of the first memory cell and a second source/drain line coupled to a second source/drain region of the first memory cell, wherein the second source/drain line is disposed in the same metallization level as the first source/drain line, a third source/drain line coupled to a first source/drain region of the second memory cell and a fourth source/drain line coupled to a second source/drain region of the second memory cell, wherein the third source/drain line is disposed proximate to the second source/drain line, and wherein the fourth source/drain line is disposed in the same metallization level as the third source/drain line, and a fifth source/drain line coupled to a first source/drain region of the third memory cell and a sixth source/drain line coupled to a second source/drain region of the third memory cell, wherein the fifth source/drain line is disposed proximate to the fourth source/drain line, and wherein the sixth source/drain line is disposed in the same metallization level as the fifth source/drain line.

FIG. 12 shows a flow diagram 1200 illustrating a method for manufacturing a memory cell arrangement. The method may include, in 1202, forming a first memory cell and a second memory cell. Furthermore, in 1204, a first source/drain line coupled to a first source/drain region of the first memory cell may be formed. In 1206, a second source/drain line coupled to a second source/drain region of the first memory cell may be formed. In 1208, a third source/drain line coupled to a first source/drain region of the second memory cell may be formed, wherein the third source/drain line is disposed proximate to the second source/drain line, and wherein the third source/drain line is disposed in the same metallization level as the second source/drain line. In 1210, a fourth source/drain line coupled to a second source/drain region of the second memory cell may be formed.

FIG. 13 shows a flow diagram 1300 illustrating a method for manufacturing a memory cell arrangement. The method may include, in 1302, forming a first memory cell, a second memory cell, and a third memory cell. In 1304, a first source/drain line coupled to a first source/drain region of the first memory cell and a second source/drain line coupled to a second source/drain region of the first memory cell may be formed, wherein the second source/drain line is disposed in the same metallization level as the first source/drain line. In 1306, a third source/drain line coupled to a first source/drain region of the second memory cell and a fourth source/drain line coupled to a second source/drain region of the second memory cell may be formed, wherein the third source/drain line is disposed proximate to the second source/drain line, and wherein the fourth source/drain line is disposed in the same metallization level as the third source/drain line. Furthermore, in 1308, a fifth source/drain line coupled to a first source/drain region of the third memory cell and a sixth source/drain line coupled to a second source/drain region of the third memory cell may be formed, wherein the fifth source/drain line is disposed proximate to the fourth source/drain line, and wherein the sixth source/drain line is disposed in the same metallization level as the fifth source/drain line.

In one or more of the above described embodiments, the lines to be decoded (e.g. the source/drain lines) may have a line width in the range from about 100 nm to about 300 nm, e.g. a line width in the range from about 150 nm to about 250 nm, e.g. a line width in the range from about 175 nm to about 225 nm. Furthermore, in one or more of the above described embodiments, the vias (e.g. the first vias and or the second vias) may have approximately a quadrangular or a elliptical shape. In the case of a quadrangular shape, each of the vias may have a width (in each main direction) in the range from about 50 nm to about 100 nm, e.g. a width (in each main direction) in the range from about 60 nm to about 90 nm, e.g. a width (in each main direction) in the range from about 70 nm to about 80 nm.

Furthermore, in one or more embodiments, the lines may be made of any suitable electrically conductive material such as e.g. of any suitable metal. In one or more of the above described embodiments, the lines may be made of copper or a copper alloy, or of aluminum or an aluminum alloy.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory cell arrangement, comprising: a first memory cell and a second memory cell; a first source/drain line coupled to a first source/drain region of the first memory cell and a second source/drain line coupled to a second source/drain region of the first memory cell; a third source/drain line coupled to a first source/drain region of the second memory cell and a fourth source/drain line coupled to a second source/drain region of the second memory cell, wherein the third source/drain line is disposed proximate to the second source/drain line, and wherein the third source/drain line is disposed in the same metallization level as the second source/drain line, wherein the first source/drain line is a first bit line; wherein the second source/drain line is a first source line; wherein the third source/drain line is a second bit line; and wherein the fourth source/drain line is a second source line.

2. The memory cell arrangement of claim 1, wherein the first source/drain line is arranged in a different metallization level than the second source/drain line.

3. The memory cell arrangement of claim 1, wherein the fourth source/drain line is arranged in a different metallization level than the second source/drain line.

4. The memory cell arrangement of claim 1, wherein the fourth source/drain line is arranged in the same metallization level as the first source/drain line.

5. The memory cell arrangement of claim 1, wherein the third source/drain line and the second source/drain line are disposed in the metallization level 3 of the memory cell arrangement; and wherein the first source/drain line and the fourth source/drain line are disposed in the metallization level 3 of the memory cell arrangement.

6. The memory cell arrangement of claim 1, further comprising: a control line to control a memory cell selected from the group consisting of the first memory cell and the second memory cell, wherein the control line is disposed in another metallization plane than the source/drain lines.

7. The memory cell arrangement of claim 6, wherein the control line is a word line.

8. The memory cell arrangement of claim 6, wherein the control line is disposed in a metallization level below the metallization levels in which the source/drain lines are disposed.

9. The memory cell arrangement of claim 1, wherein at least one of the memory cells is a non-volatile memory cell.

10. A memory cell arrangement, comprising: a first memory cell and a second memory cell; a first source/drain line coupled to a first source/drain region of the first memory cell and a second source/drain line coupled to a second source/drain region of the first memory cell; a third source/drain line coupled to a first source/drain region of the second memory cell and a fourth source/drain line coupled to a second source/drain region of the second memory cell, wherein the third source/drain line is disposed proximate to the second source/drain line, and wherein the third source/drain line is disposed in the same metallization level as the second source/drain line, wherein the first source/drain line is a first source line; wherein the second source/drain line is a first bit line; wherein the third source/drain line is a second source line; and wherein the fourth source/drain line is a second bit line.

11. The memory cell arrangement of claim 10, wherein the first source/drain line is arranged in a different metallization level than the second source/drain line.

12. The memory cell arrangement of claim 10, wherein the fourth source/drain line is arranged in a different metallization level than the second source/drain line.

13. The memory cell arrangement of claim 10, wherein the fourth source/drain line is arranged in the same metallization level as the first source/drain line.

14. The memory cell arrangement of claim 10, wherein the third source/drain line and the second source/drain line are disposed in the metallization level 3 of the memory cell arrangement; and wherein the first source/drain line and the fourth source/drain line are disposed in the metallization level 3 of the memory cell arrangement.

15. The memory cell arrangement of claim 10, further comprising: a control line to control a memory cell selected from the group consisting of the first memory cell and the second memory cell, wherein the control line is disposed in another metallization plane than the source/drain lines.

16. The memory cell arrangement of claim 15, wherein the control line is a word line.

17. The memory cell arrangement of claim 15, wherein the control line is disposed in a metallization level below the metallization levels in which the source/drain lines are disposed.

18. The memory cell arrangement of claim 10, wherein at least one of the memory cells is a non-volatile memory cell.

19. A memory cell arrangement, comprising: a first memory cell and a second memory cell; a first line to be decoded being coupled to a first contact region of the first memory cell and a second line to be decoded being coupled to a second contact region of the first memory cell; a third line to be decoded being coupled to a first contact region of the second memory cell and a fourth line to be decoded being coupled to a second contact region of the second memory cell, wherein the third line is disposed proximate to the second line, and wherein the third line is disposed in the same metallization level as the second line; and a control line to control the decoding of at least one memory cell selected from the group consisting of the first memory cell and the second memory cell, wherein the control line is disposed in another metallization plane than the lines to be decoded, wherein the first line is a first bit line; wherein the second line is a first source line; wherein the third line is a second bit line; and wherein the fourth line is a second source line.

20. The memory cell arrangement of claim 19, wherein the fourth line to be decoded is arranged in the same metallization level as the first line to be decoded.

21. The memory cell arrangement of claim 19, wherein the third line to be decoded and the second line to be decoded are disposed in the metallization level 3 of the memory cell arrangement; and wherein the first line to be decoded and the fourth line to be decoded are disposed in the metallization level 3 of the memory cell arrangement.

22. The memory cell arrangement of claim 19, wherein the control line is a word line.

23. The memory cell arrangement of claim 19, wherein the control line is disposed in a metallization level below the metallization levels in which the lines to be decoded are disposed.

24. The memory cell arrangement of claim 19, wherein at least one of the memory cells is a non-volatile memory cell.

25. A memory cell arrangement, comprising: a plurality of first memory cells arranged along a first direction; a plurality of second memory cells arranged along a second direction, wherein the second direction is different from the first direction; a first source/drain line coupled to each first source/drain region of the first memory cells and a second source/drain line coupled to each second source/drain region of the first memory cells; and a third source/drain line coupled to each first source/drain region of the second memory cells and a fourth source/drain line coupled to each second source/drain region of the second memory cells, wherein the third source/drain line is disposed proximate to the second source/drain line, and wherein the third source/drain line is disposed in the same metallization level as the second source/drain line, wherein the first source/drain line is a first bit line; wherein the second source/drain line is a first source line; wherein the third source/drain line is a second bit line; and wherein the fourth source/drain line is a second source line.

26. The memory cell arrangement of claim 25, wherein the first direction is a first memory cell arrangement column; and wherein the second direction is a second memory cell arrangement column.

27. The memory cell arrangement of claim 25, wherein at least one of the memory cells is a non-volatile memory cell.

28. A memory cell arrangement, comprising: a first memory cell; a second memory cell; a third memory cell; a first source/drain line coupled to a first source/drain region of the first memory cell and a second source/drain line coupled to a second source/drain region of the first memory cell; a third source/drain line coupled to a first source/drain region of the second memory cell and a fourth source/drain line coupled to a second source/drain region of the second memory cell, wherein the third source/drain line is disposed proximate to the second source/drain line, and wherein the third source/drain line is disposed in the same metallization level as the second source/drain line; and a fifth source/drain line coupled to a first source/drain region of the third memory cell and a sixth source/drain line coupled to a second source/drain region of the third memory cell, wherein the fifth source/drain line is disposed proximate to the fourth source/drain line, and wherein the fifth source/drain line is disposed in the same metallization level as the fourth source/drain line, wherein the first source/drain line is a first bit line; wherein the second source/drain line is a first source line; wherein the third source/drain line is a second bit line: wherein the fourth source/drain line is a second source line; wherein the fifth source/drain line is a third bit line; and wherein the sixth source/drain line is a third source line.

29. The memory cell arrangement of claim 28, wherein the fourth source/drain line is arranged in the same metallization level as the first source/drain line.

30. The memory cell arrangement of claim 28, wherein the sixth source/drain line is arranged in the same metallization level as the second source/drain line.

31. The memory cell arrangement of claim 28, wherein at least one of the memory cells is a non-volatile memory cell.

32. A memory cell arrangement, comprising: a plurality of first memory cells arranged along a first direction; a plurality of second memory cells arranged along a second direction, wherein the second direction is different from the first direction; a first source/drain line coupled to each first source/drain region of the first memory cells and a second source/drain line coupled to each second source/drain region of the first memory cells, wherein the second source/drain line is disposed in the same metallization level as the first source/drain line; and a third source/drain line coupled to each first source/drain region of the second memory cells and a fourth source/drain line coupled to each second source/drain region of the second memory cells, wherein the fourth source/drain line is disposed in the same metallization level as the third source/drain line, wherein the first source/drain line is a first bit line; wherein the second source/drain line is a first source line; wherein the third source/drain line is a second bit line; and wherein the fourth source/drain line is a second source line.

33. A memory cell arrangement, comprising: a first memory cell; a second memory cell; a third memory cell; a first source/drain line coupled to a first source/drain region of the first memory cell and a second source/drain line coupled to a second source/drain region of the first memory cell, wherein the second source/drain line is disposed in the same metallization level as the first source/drain line; a third source/drain line coupled to a first source/drain region of the second memory cell and a fourth source/drain line coupled to a second source/drain region of the second memory cell, wherein the third source/drain line is disposed proximate to the second source/drain line, and wherein the fourth source/drain line is disposed in the same metallization level as the third source/drain line; and a fifth source/drain line coupled to a first source/drain region of the third memory cell and a sixth source/drain line coupled to a second source/drain region of the third memory cell, wherein the fifth source/drain line is disposed proximate to the fourth source/drain line, and wherein the sixth source/drain line is disposed in the same metallization level as the fifth source/drain line, wherein the first source/drain line is a first bit line; wherein the second source/drain line is a first source line; wherein the third source/drain line is a second bit line; wherein the fourth source/drain line is a second source line; wherein the fifth source/drain line is a third bit line; and wherein the sixth source/drain line is a third source line.

* * * * *